United States Patent
Du et al.

(10) Patent No.: US 10,641,853 B2
(45) Date of Patent: *May 5, 2020

(54) SYSTEMS AND METHODS FOR ULTRASHORT ECHO TIME ACTUAL FLIP ANGLE IMAGING AND VARIABLE REPETITION TIME MAGNETIC RESONANCE IMAGING

(71) Applicant: The Regents of the University of California, Oakland, CA (US)

(72) Inventors: Jiang Du, San Diego, CA (US); Yajun Ma, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,536

(22) Filed: Sep. 7, 2018

(65) Prior Publication Data
US 2019/0079154 A1    Mar. 14, 2019

Related U.S. Application Data

(60) Provisional application No. 62/555,952, filed on Sep. 8, 2017.

(51) Int. Cl.
*G06T 7/00* (2017.01)
*A61B 5/00* (2006.01)
(Continued)

(52) U.S. Cl.
CPC ....... *G01R 33/4816* (2013.01); *G01R 33/246* (2013.01); *G01R 33/50* (2013.01); *G01R 33/5602* (2013.01); *G01R 33/5608* (2013.01)

(58) Field of Classification Search
CPC . A61B 5/055; A61B 2576/026; A61B 5/4064; A61B 5/0042; A61B 5/0263;
(Continued)

(56) References Cited

U.S. PATENT DOCUMENTS 9,507,000 B2 * 11/2016 Stehning ............... A61B 5/055
2017/0172495 A1 * 6/2017 Mountford ........... A61B 5/4824

OTHER PUBLICATIONS

Deoni et al., "Rapid combined T1 and T2 mapping using gradient recalled acquisition in the steady state", Magnetic Resonanace in Medicine 2003;49(3):515-26. (Year: 2003).*

(Continued)

*Primary Examiner* — Alesa Allgood
(74) *Attorney, Agent, or Firm* — Perkins Coie LLP

(57) ABSTRACT

Disclosed are systems and methods for accurately measuring T1 in magnetic resonance imaging (MRI) for short T2 tissues by an integrative three-dimensional Ultrashort Echo Time Actual Flip Angle Imaging Variable TR (3D UTE-AFI-VTR) technique. Also, disclosed are systems and methods for accurately measuring T1 for T2 tissues by an integrative three-dimensional Ultrashort Echo Time Actual Flip Angle Imaging Variable Flip Angle (3D UTE-AFI-VFA) technique. The disclosed methods and systems can be implemented to allow accurate T1 mapping for T2 tissues, including menisci, ligaments, tendons, myelin in gray and white matter, cortical bone, and soft tissue in whole joints.

19 Claims, 17 Drawing Sheets

(51) Int. Cl.
  *G01R 33/48* (2006.01)
  *G01R 33/56* (2006.01)
  *G01R 33/24* (2006.01)
  *G01R 33/50* (2006.01)

(58) Field of Classification Search
  CPC .......................... G01R 33/50; G01R 33/4828; G01R 33/5608; G01R 33/5602; G01R 33/543; G01R 33/56; G06T 7/0012; G06T 2207/10088
  See application file for complete search history.

(56) References Cited

OTHER PUBLICATIONS

Du et al., "Measurement of T1 of the ultrashort T2* components in white matter of the brain at 3T", Plos One. 2014 5;9 (8):e103296. (Year: 2014).*
Han, et al., Actual flip angle imaging to improve T1 measurement for short T2 tissues. In: Proc 23rd Annu Meeting of SMRM, Toronto, Ontario, Canada, 2015. p. 501. (Year: 2015).*
Kobayashi et al., "B1 mapping of short I2* spins using a 3D radial gradient echo sequence", Magnetic Resonanace in Medicine 2014;71 (5):1689-1699. (Year: 2014).*
Cunningham et al., "Saturated double-angle method for rapid B1 mapping", Magn Reson Med 2006;55:1326-1333.
Deoni et al., "High Resolution T1 and T2 Mapping of the Brain in a Clinically Acceptable Time with DESPOT1 and DESPOT2", Magnetic Resonance in Medicine, 53,2005, pp. 237-241.
Deoni, "High-resolution Ti mapping of the brain at 3T with driven equilibrium single pulse observation of T1 with high-speed incorporation of Rf field inhomogeneities (DESPOT1-HIFI)", J Magn Reson Imaging 2007;26:1106-1111.
Deoni et al., "Rapid combined T1 and T2 mapping using gradient recalled acquisition in the steady state", Magn Reson Med 2003;49(3):515-26.
Du et al., "Qualitative and quantitative ultrashort-TE MRI of cortical bone", NMR Biomed 2013;26:489-506.
Du et al., "Measurement of T1 of the ultrashort T2* components in white matter of the brain at 3T", PloS one. 2014 5;9 8):e103296.
Gurney et al., "Design and analysis of a practical 3D cones trajectory", Magn Reson Med 2006;55:575-582.
Han, et al., Actual flip angle imaging to improve T1measurement for short T2 tissues. In: Proc 23rd Annu Meeting of Ismrm, Toronto, Ontario, Canada, 2015. p. 501.

Hurley et al., "Simultaneous variable flip angle—actual flip angle imaging method for improved accuracy and precision of three-dimensional T1 and B1 measurements", Magn Reson Med 2012;68(1):54-64.
Jird et al., "Fast 3D radiofrequency field mapping using echoplanar imaging", Magn Reson Med 2006;56:1375-1379.
Kharas, M.G. et al., Mesashi-2 regulates normal hematopoiesis and promotes aggressive myeloid leukemia, Nat Med. 2010 Aug., 16(18), pp. 903-908.
Kobayashi et al., "B1 mapping of short T2* spins using a 3D radial gradient echo sequence", Magn Reson Med 2014;71(5):1689-99.
Lustig et al., "Sparse MRI: The application of compressed sensing for rapid MR imaging", Magn Reson Med 2007;58 6):1182-95.
Morrell, "A phase-sensitive method of flip angle mapping", Magn Reson Med 2008;60:889-894.
Sacolick et al., "B1 mapping by Bloch-Siegert shift", Magn Reson Med 2010;63:1315-1322.
Stanisz et al,. "T1, T2 relaxation and magnetization transfer in tissue at 3T", Magn Reson Med 2005;54(3):507-12.
Nang et al., "Rapid 3D radiofrequency field mapping using catalyzed double-angle method", NMR Biomed 2009;22:882-890.
Yarnykh, "Actual flip-angle imaging in the pulsed steady state: a method for rapid three-dimensional mapping of the transmitted radiofrequency field", Magn Reson Med 2007;57:192-200.
Baudrexel et al., Quantitative mapping of T1 and T2* discloses nigral and brainstem pathology in early Parkinson's disease, Neurolmage 51,2010, pp. 512-520.
Boudreau, M. et al., "B1 Mapping for Bias-Correction in Quantitative T1 Imaging of the Brain at 3T Using Standard Plus Sequences", International Society for Magnetic Resonance in Medicine, 2017, pp. 1673-1682.
Carl, M. et a;., "Optimization of RF Excitation to Maximize Signal and T2 Contrast of Tissues With Rapid Transverse Relaxation", Magnetic Resonance in Medicine 64,2010, pp. 481-490.
Carl, M. et al., "UTE Imaging with Simultaneous water and Fat Signal Suppression Using a Time-Efficient Multispoke Inversion Recov ery Pulse Sequence", Magn Reson Med. 2016, 76(2), pp. 577-582.
Chavez, S. et al., "A simple and fast slip angle calibration method", Proc. Intl. Soc. Mag. Reson. Med. 17, 2009, p. 375.
Chen, J. et aL, "Measurement of Bound and Pore Water T1 Relaxation Times in Cortical Bone Using Three-Dimensional Ultrashort Echo Time Cones (3D UTE Cones) Sequences", Magn Reson Med. 2017, 77(6), pp. 2136-2145.
Cheng, H.-L. M. et al., "Rapid High-Resolution T1 Mapping by Variable Flip Angles: Accurate and Precise Measurements in the Presence of Radiofrequency Field Inhomogeneity", Magnetic Resonance in Medicine 55, 2016, v. 566-574.

* cited by examiner

221

222
Assign the longitudinal magnetization mapping function, $f_{z,s}(\alpha, \tau, T2)$, as $(r\,n - 1)/(n - r)$, where $r$ is the signal ratio of the first MR data set and second MR data set $(S_1/S_2)$, and $n$ is the ratio of TR1/TR2

224
Combine the magnetization in thermal equivalent coefficient ($M_0$) and the transversal mapping function, $f_{xy,s}(\alpha, \tau, T2)$, into a single unknown parameter ($g$)

226
Determine T1 measurements by fitting the acquired MR data with variable TR values

FIG. 2C

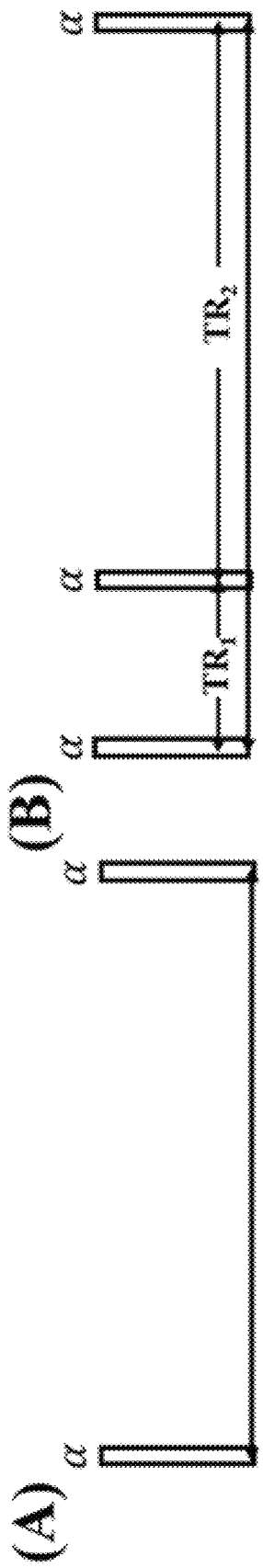
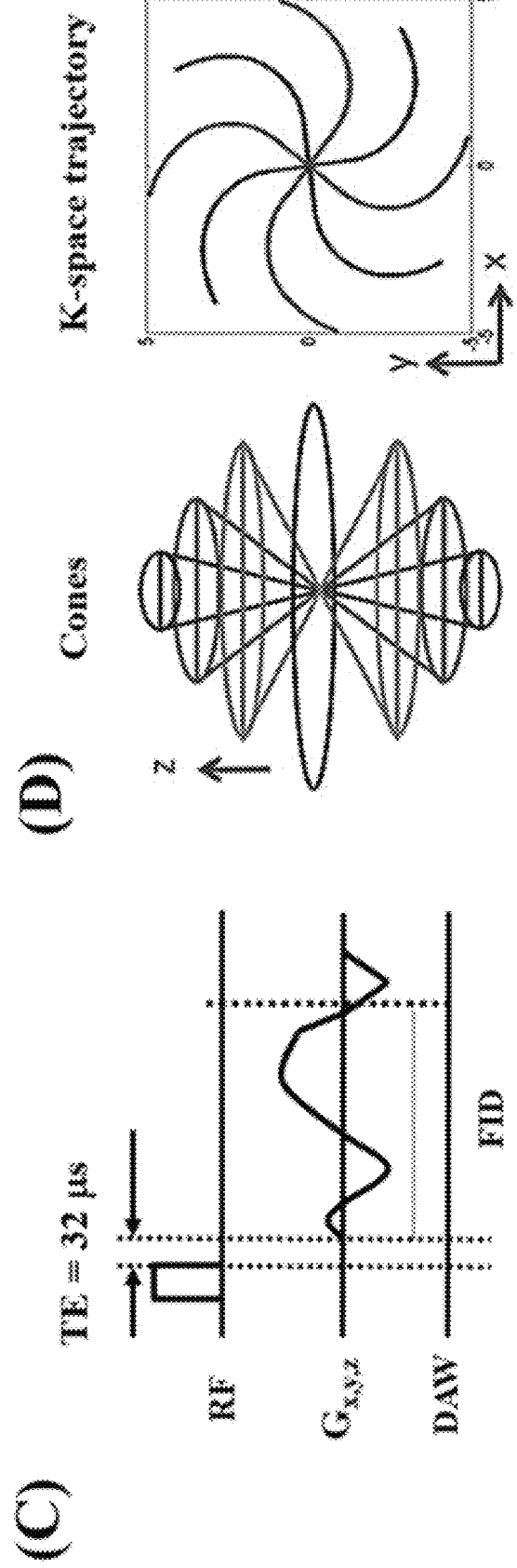
FIG. 3A
FIG. 3B
FIG. 3C
FIG. 3D

SYSTEMS AND METHODS FOR ULTRASHORT ECHO TIME ACTUAL FLIP ANGLE IMAGING AND VARIABLE REPETITION TIME MAGNETIC RESONANCE IMAGING

CROSS-REFERENCE TO RELATED APPLICATIONS

This patent document claims priorities to and benefits of U.S. Provisional Patent Application No. 62/555,952 entitled "SYSTEMS AND METHODS FOR ULTRASHORT ECHO TIME AND FLIP ANGLE IMAGING AND VARIABLE REPETITION TIME MAGNETIC RESONANCE IMAGING" filed on Sep. 8, 2017. The entire content of the aforementioned patent application is incorporated by reference as part of the disclosure of this patent document.

TECHNICAL FIELD

This patent document relates to systems, devices, and processes that use magnetic resonance imaging (MRI) technologies.

BACKGROUND

MRI is a medical imaging technique based on the magnetization properties of atomic nuclei. During an MRI imaging procedure, a magnetic field and a pulse of radio frequency (RF) energy are applied to a target such as a living subject or tissue specimen to produce an image used for imaging internal biological structures. The applied magnetic field aligns the protons that are normally randomly oriented within the water nuclei of the target being examined. This alignment is then perturbed by the applied RF pulse energy, such that the nuclei return to their resting orientations through various relaxation processes, and thereby emit RF energy which is measurable. For example, the emitted RF energy is measured according to certain time periods following the applied RF pulse. Temporal parameters, including repetition time (TR) and echo time (TE), associated with the temporal sequence of RF pulses applied and the collection of echo signal following an initial excitation pulse can be varied to create different types of MR images. Repetition time is the amount of time between successive RF pulse sequences applied to the same region of the target (e.g., same volume slice), and echo time is the time between the RF pulse delivery and the receipt of the echo signal. The measured data is processed using signal processing techniques to produce the MR images, e.g., including Fourier transformation to convert the frequency information contained in the measured signals from each location in the imaged plane to corresponding intensity levels, which are then displayed as shades of gray in a matrix arrangement of pixels.

MRI is based on the property of nuclear magnetic resonance (NMR). NMR is a physical property in which the nuclei of atoms absorb and re-emit electromagnetic energy at a specific resonance frequency in the presence of a magnetic field. The absorption and reemission of energy can be dependent on the strength of the magnetic field and the magnetic property of the atoms (e.g., atoms whose nuclei possesses magnetic spin).

SUMMARY

Disclosed are systems and methods for accurately measuring T1 in magnetic resonance imaging (MRI) for short T2 tissues by an integrative three-dimensional Ultrashort Echo Time Actual Flip Angle Imaging and Variable TR Method (3D UTE-AFI-VTR). Also, disclosed are systems and methods for accurately measuring T1 for T2 tissues by an integrative three-dimensional Ultrashort Echo Time Actual Flip Angle Imaging Variable Flip Angle (3D UTE-AFI-VFA) technique. The disclosed methods and systems can be implemented to allow accurate T1 mapping for T2 tissues, including menisci, ligaments, tendons, myelin in gray and white matter, cortical bone, and soft tissue in whole joints.

In some aspects, a magnetic resonance imaging (MRI) method for characterizing a tissue includes (a) acquiring magnetic resonance (MR) data from a tissue using an MRI system in accordance with an ultrashort echo time actual flip angle imaging (UTE AFI) procedure to produce a longitudinal magnetization mapping function of radio frequency (RF) pulses applied to the tissue, in which the tissue includes a short T2 tissue region and a long T2 tissue region, wherein the acquiring the MR data includes: (i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and (ii) generating the longitudinal magnetization mapping function of the applied RF pulses from the first MR data set corresponding to short T2 tissue and from the second MR data set corresponding to long T2 tissue within the target tissue; (b) applying a T1 mapping for the short T2 tissue region and the long T2 tissue region using a variable repetition time (VTR) fitting procedure to produce a T1 measurement associated with at least a portion of the short T2 tissue region; and (c) producing an image providing the T1 measurements with respect to the tissue indicative of the, at least portion of, short T2 tissue region of the tissue.

In some aspects, a magnetic resonance imaging (MRI) system for characterizing a tissue includes an MRI acquisition system including a magnet to generate a principal magnetic field ($B_0$), a radio frequency (RF) subsystem to apply a plurality of RF pulses to a tissue and to detect an echo signal, and a gradient subsystem to apply a plurality of gradient fields to the tissue, in which the tissue includes a short T2 tissue region and a long T2 tissue region; and a data processing device in communication with the MRI acquisition system and including a processor and memory, the data processing device configured to: (a) cause the MRI acquisition system to acquire magnetic resonance (MR) data of the tissue in accordance with an ultrashort echo time actual flip angle (UTE-AFI) procedure, (b) process the acquired MR data to produce a longitudinal magnetization mapping function of the plurality of RF pulses applied to the tissue; and (b) apply a T1 mapping for the short T2 tissue region and the long T2 tissue region using a variable repetition time (VTR) fitting procedure to produce a T1 measurement associated with at least a portion of the short T2 tissue region, in which the data processing device acquires the MR data by applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher, and in which the data processing device processes the acquired MR data by generating the longitudinal magnetization mapping function of the applied RF pulses from the first MR data set corresponding to short T2 tissue and from the second MR data set corresponding to long T2 tissue within the target tissue.

In some aspects, a magnetic resonance imaging (MRI) method for characterizing a tissue includes (a) acquiring magnetic resonance (MR) data from a tissue using an MRI system in accordance with an ultrashort echo time actual flip angle imaging (UTE AFI) procedure to produce a B1 inhomogeneity map of the tissue, in which the tissue includes a short T2 tissue region and a long T2 tissue region, wherein the acquiring the MR data includes: (i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and (ii) generating the B1 inhomogeneity map from the first MR data set corresponding to short T2 tissue and from the second MR data set corresponding to long T2 tissue within the target tissue; (b) applying a T1 mapping for the short T2 tissue region and the long T2 tissue region using a variable flip angle (VFA) fitting procedure to produce a T1 measurement associated with at least a portion of the short T2 tissue region; and (c) producing an image providing the T1 measurements with respect to the tissue indicative of the, at least portion of, short T2 tissue region of the tissue.

The subject matter described in this patent document can be implemented in specific ways that provide one or more of the following features.

BRIEF DESCRIPTION OF THE DRAWINGS

FIGS. 2A-2C show diagrams of example embodiments of a 3D UTE-AFI-VTR method in accordance with the present technology for characterizing tissue.

FIGS. 3A-3D show diagrams depicting 3D conventional UTE-Cones with a single TR and UTE-Cones AFI sequences for T1 measurements, 3D spiral sampling with a minimal nominal TE, and spiral trajectories arranged with conical view ordering.

DETAILED DESCRIPTION

Figure 1:
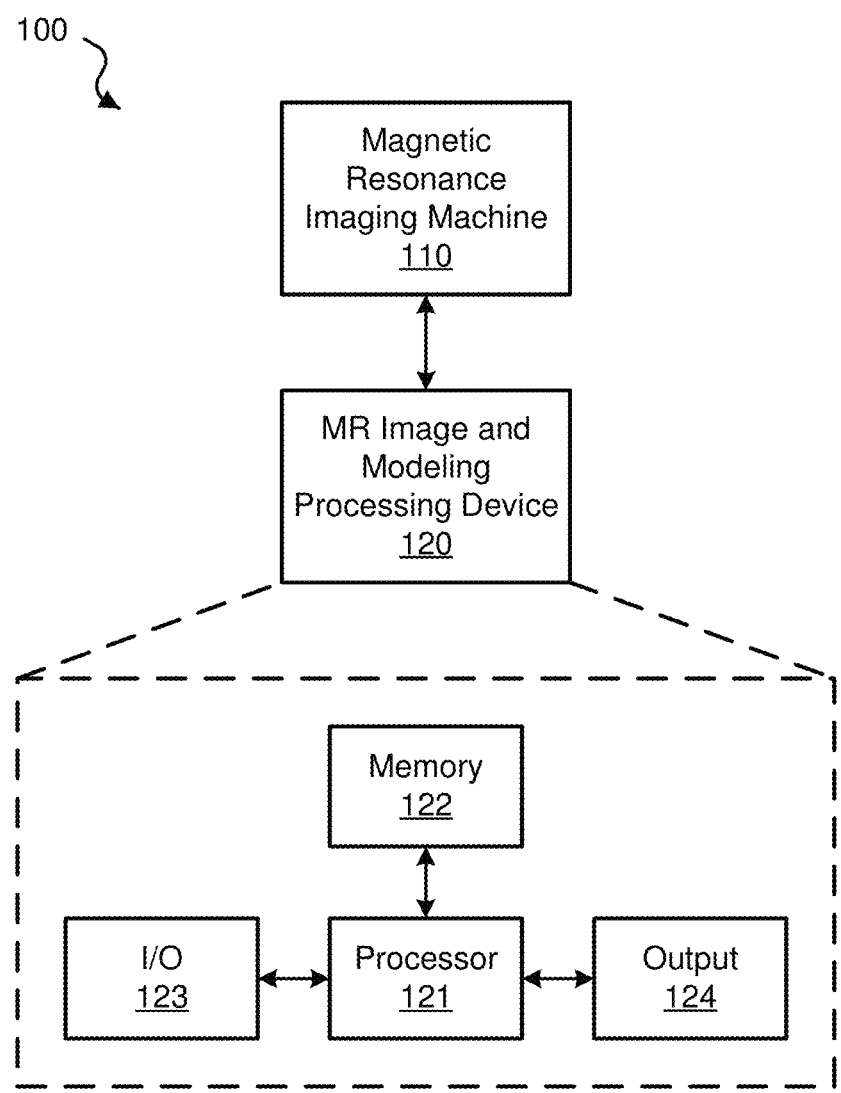
FIG. 1 shows an example embodiment of a magnetic resonance imaging (MRI) and signal processing system for three-dimensional ultrashort echo time actual flip angle imaging and variable repetition time (3D UTE-AFI-VTR) in accordance with the present technology for providing quantitative, noninvasive and accurate T1 measurements in tissue.

Over the past several decades, extensive research has been performed on the use of magnetic resonance (MR) imaging biomarkers for the evaluation of tissues. In MR imaging, tissue can be characterized by different relaxation times, referred to as longitudinal relaxation time (T1) and transverse relaxation time (T2). T1 is a time constant that determines the rate at which excited protons return to equilibrium. For example, T1 is a measure of time for spinning protons to realign with the external magnetic field applied to the tissue. T2 is a time constant that determines the rate at which excited protons reach equilibrium or go out of phase with each other. For example, T2 is a measure of the time taken for spinning protons to lose phase coherence among the nuclei spinning perpendicular to the main field.

Accurate T1 measurement is important for both basic understanding and clinical properties. T1 measurements are one of the most basic parameters of tissue properties, and from a clinical perspective, T1 changes are related to tissue degeneration. Many quantitative MRI measurements require T1 correction (especially for short T2 tissues), such as UTE T1rho, UTE adiabatic T1rho, UTE magnetization transfer (UTE-MT) modeling, UTE measurement of bound and free water components, etc.

Variable flip angle (VFA) and variable repetition time (VTR) methods based on three-dimensional spoiled gradient recalled echo (3D SPGR) sequences have been widely used for volumetric T1 measurement in conventional systems. However, both the VFA and VTR methods are very sensitive to inhomogeneity in the transmitted rotating RF magnetic field (B1 field). So typically, the first step for accurate T1 measurement is to get the spatial B1 maps. Then the measured B1 maps are used for accurate T1 calculation. Implementing these processes requires significant time and computational resources, and thereby contributing factors to the present high cost of MRI procedures in the clinical setting.

Actual flip angle imaging (AFI) is a technique that has been proposed for fast 3D B1 mapping. It utilizes interleaved acquisitions of the dual-TR steady state that is formed by alternately changing TR in a conventional SPGR sequence with an echo time of several milliseconds. The robustness of the AFI technique has been demonstrated in long T2 tissues of the human body. The typical AFI sequence cannot be used for B1 mapping of short T2 tissues or tissue components such as cortical bone, calcified cartilage, menisci, ligaments, tendons, etc. Those short T2 tissues have T2 values from several hundred microseconds to a few milliseconds, and are dark when imaged with the conventional SPGR sequence. Ultrashort echo time (UTE)

sequences with echo times less than 100 µs have been developed for short T2 imaging. Therefore, the combination of UTE and AFI technique (UTE-AFI) may be used to map flip angles for short T2 tissues.

However, it is technically challenging to accurately map flip angles for short T2 tissues such as cortical bone. Transverse relaxation during the excitation process is typically ignored for long T2 tissues, but may be significant for short T2 tissues. Large flip angles (e.g., >40°) are typically required for increasing the sensitivity of the AFI technique. With the peak power limitation of the radiofrequency (RF) amplifiers on clinical scanners, the RF duration needs to be increased to get high flip angle excitations. The excitation efficiency will be decreased for the imaging of short T2 tissues with a longer RF excitation pulse, which means that the real flip angles will be less than the nominal flip angles. This will lead to increased B1 estimation errors for the UTE-AFI method when imaging the short T2 tissues (details can be found in the theory section below). As a result, inaccurate T1 measurement is expected for short T2 tissues when using the inaccurate B1 maps for correction.

The disclosed methods and systems are designed to overcome these and other challenges.

Disclosed are systems and methods for accurately measuring T1 in magnetic resonance imaging (MRI) for short T2 tissues by an integrative three-dimensional Ultrashort Echo Time Actual Flip Angle Imaging and Variable Repetition Time method (3D UTE-AFI-VTR). The disclosed methods and systems can be implemented to allow accurate T1 mapping for short T2 tissues such as the menisci, ligaments, tendons, myelin in gray and white matter and cortical bone. The disclosed systems and methods are envisioned to have a major impact on the diagnosis and monitoring of osteoarthritis (OA), osteoporosis (OP), tendon diseases, and other musculoskeletal (MSK) and neurological diseases.

Example embodiments and implementations of the disclosed methods and systems are described herein. For example, in some implementations of a 3D UTE-AFI-VTR method in accordance with example embodiments of the present technology, the longitudinal magnetization mapping function of the excitation pulse is obtained with the 3D UTE AFI method, which contains the information of the excitation efficiency and B1 inhomogeneity. Then the derived mapping function is substituted into the VTR fitting to get the accurate T1 maps. In an example implementation discussed in this disclosure, comparisons between a method with B1 uncorrected VTR and variable flip angle (VFA) methods, and with a B1 corrected VFA method, were performed through numerical simulation and phantom studies. Also, an example embodiment of the 3D UTE-AFI-VTR method was applied to bovine bone samples (n=6) and healthy volunteers (n=3) to quantify T1 for cortical bone.

In some implementations, for example, the disclosed 3D UTE-AFI-VTR method can be used to produce new T1 measurements for short T2 tissues that integrates aspects of 3D UTE-Cones AFI with UTE-Cones VTR techniques (also referred to as "3D UTE-Cones AFI-VTR") in a manner capable of overcoming the technical challenges for providing accurate T1 measurements. For example, the same RF pulses and flip angles can be used for signal excitation in the two types of sequences. Using the example 3D UTE-Cones AFI-VTR method, B1 maps are no longer needed for T1 correction. Instead, the longitudinal magnetization mapping function of the excitation pulse can be obtained by the 3D UTE-Cones AFI method for further VTR based T1 fitting.

There are many short T2 tissues or tissue components such as cortical bone, subchondral bone, deep radial and calcified layers of articular cartilage, menisci, ligaments, tendons, iron overload, myelin in white and gray matters, etc., which have very short apparent transverse relaxation times (T2*s) and show as little or no signal with conventional clinical MRI techniques. Conventional clinical MR techniques are incapable of accurately measuring their T1 relaxation times. The disclosed 3D UTE-AFI-VTR methods and systems are envisioned to allow accurate T1 mapping for those short T2 tissues.

FIG. 1 shows an example embodiment of a three-dimensional ultrashort echo time actual flip angle imaging and variable repetition time (3D UTE-AFI-VTR) MR imaging and signal processing system 100 for providing a quantitative, noninvasive and accurate T1 measurements in imaged tissue, e.g., in a living patient subject or tissue sample. FIG. 1 shows one aspect of the example system 100 that includes a magnetic resonance imaging (MRI) machine 110 in communication with an MR image and signal processing device 120, e.g., which can be used to control the MRI machine and analyze obtained data to affect the image data collecting protocol to produce quantitative data of the T1 measurements.

The MRI machine 110 can be used in the system 100 to implement a MRI-based characterization process under the control of the example MR image and signal processing device 120. MRI machine 110 can include various types of MRI systems, which can perform at least one of a multitude of MRI scans that can include, but are not limited to, T1-weighted MRI scans, T1ρ MRI scans, T2-weighted MRI scans, T2*-weighted MRI scans, spin (proton ($^1$H)) density weighted MRI scans, diffusion tensor (DT) and diffusion weighted imaging (DWI) MRI scans, magnetization transfer (MT) MRI scans, real-time MRI, functional MRI (fMRI) and related techniques such as arterial spin labeling (ASL), among other MRI techniques.

The MR image and signal processing device 120 can include a processor 121 that can be in communication with a memory unit 122, an input/output (I/O) unit 123, and/or an output unit 124. The MR image and signal processing device 120 can be implemented as one of various data processing systems, such as a personal computer (PC), laptop, and mobile computing device such as a smartphone, tablet and/or wearable computing device. In some implementations, the MR image and signal processing device 120 is embodied on one or more computing devices in a computer system or communication network accessible via the Internet (referred to as "the cloud"), e.g., including servers and/or databases in the cloud.

The processor 121 is configured to process data, and the memory unit 122 is in communication with the processor 121 to store and/or buffer the data. To support various functions of the MR image and signal processing device 120, the processor 121 can be included to interface with and control operations of other components of the MR image and signal processing device 120, such as the I/O unit 123 and/or the output unit 124. The processor 121 can include one or more processors, e.g., including but not limited to microprocessors such as a central processing unit (CPU), microcontrollers, or the like.

The memory unit 122 can include and store processor-executable code, which when executed by the processor, configures the MR image and signal processing device 120 to perform various operations, e.g., such as receiving information, commands, and/or data, processing information and data, and transmitting or providing information/data to another device. The memory unit 122 can store other information and data, such as instructions, software, values, images, and other data processed or referenced by processor 121. For example, various types of Random Access Memory (RAM) devices, Read Only Memory (ROM) devices, Flash Memory devices, and other suitable storage media can be used to implement storage functions of memory unit 122. The memory unit 122 can store MRI data and information, which can include subject MRI image data including spatial and spectral data, MRI machine system parameters, data processing parameters, and processed parameters and data that can be used in the implementation of MR signal and data processing techniques, including 3D UTE-AFI and/or VTR techniques in accordance with the disclosed technology. The memory unit 122 can store data and information that can be used to implement a MRI-based imaging and signal characterization method, e.g., including one or more algorithms for implementing a 3D UTE-AFI-VTR method, and store data and information that can be generated from a MRI-based 3D UTE-AFI-VTR algorithm and model.

In some implementations, the MR image and signal processing device 120 includes an input/output unit (I/O) 123 to interface the processor 121 and/or memory unit 122 to other modules, units or devices associated with the system 100, and/or external devices. The I/O unit 123 can connect to an external interface, source of data storage, or display device. Various types of wired or wireless interfaces compatible with typical data communication standards, such as Universal Serial Bus (USB), IEEE 1394 (FireWire), Bluetooth, Bluetooth low energy (BLE), ZigBee, IEEE 802.11, Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), 3G/4G/LTE cellular communication methods, and parallel interfaces, can be used to implement I/O unit 123. In some implementations, for example, the MR image and signal processing device 120 includes a wireless communications unit, e.g., such as a transmitter (Tx) or a transmitter/receiver (Tx/Rx) unit. The I/O unit 123 can interface the processor 121 and memory unit 122 with the wireless communications unit to utilize various types of wireless interfaces, such as the examples described above. The I/O unit 123 can interface with other external interfaces, sources of data storage, and/or visual or audio display devices, etc. to retrieve and transfer data and information that can be processed by the processor 121, stored in the memory unit 122, or exhibited on an output unit of a user device (e.g., display screen of a computing device) or an external device.

To support various functions of the MR image and signal processing device 120, the output unit 124 can be used to exhibit data implemented by the example device 120. The output unit 124 can include various types of display, speaker, or printing interfaces to implement output functionalities the system 100. In some embodiments, for example, the output unit 124 can include cathode ray tube (CRT), light emitting diode (LED), or liquid crystal display (LCD) monitor or screen as a visual display. In some examples, the output unit 124 can include toner, liquid inkjet, solid ink, dye sublimation, inkless (such as thermal or UV) printing apparatuses to implement some output modalities of the output unit 124. In some examples, the output unit 124 can include various types of audio signal transducer apparatuses. The output unit 124 can exhibit data and information, such as patient diagnostic data, MRI machine system information, partially processed MRI-based 3D UTE-AFI-VTR characterization processing information, and/or fully-processed MRI-based 3D UTE-AFI-VTR characterization processing information.

In some implementations, the MR imaging and signal processing system 100 is configured to implement a 3D UTE-AFI-VTR method in accordance with the present technology. For example, the system 100 can implement a magnetic resonance imaging (MRI) method for characterizing a tissue that includes acquiring magnetic resonance data from the tissue in accordance with an ultrashort echo time actual flip angle imaging procedure; and producing T1 maps associated with the tissue by applying a variable repetition time fitting procedure.

Figure 2A:
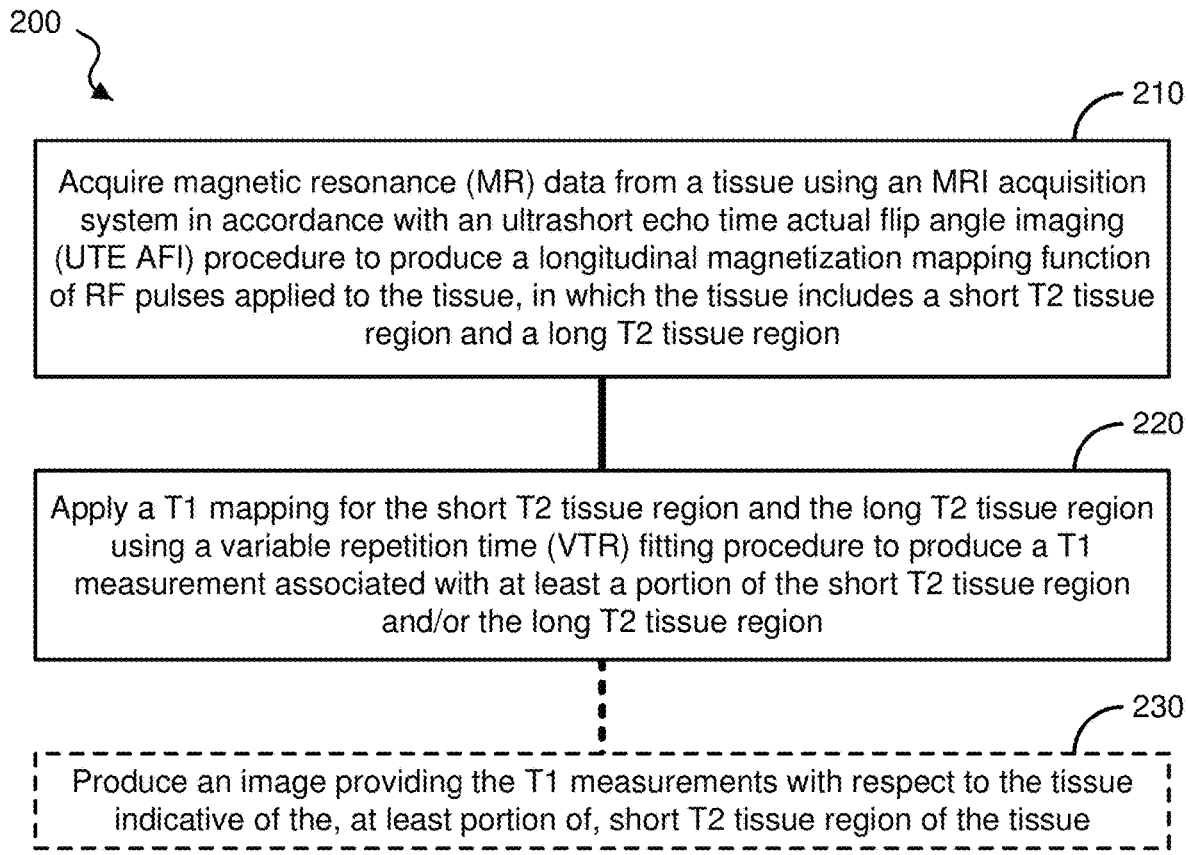

FIG. 2A shows a diagram of an example embodiment of a three-dimensional Ultrashort Echo Time Actual Flip Angle Imaging and Variable TR (3D UTE-AFI-VTR) method 200 in accordance with the present technology, which can be implemented for characterizing tissue, including short T2 tissues or tissue components, e.g., such as cortical bone, subchondral bone, deep radial and calcified layers of articular cartilage, menisci, ligaments, tendons, iron overload, myelin in white and gray matters, etc. The example 3D UTE-AFI-VTR method 200 can be implemented using the system 100 shown in FIG. 1.

The method 200 includes a process 210 to acquire magnetic resonance (MR) data from the tissue using an MRI acquisition system (e.g., MRI machine 110) in accordance with an ultrashort echo time actual flip angle imaging (UTE AFI) procedure to produce a longitudinal magnetization mapping function of the inhomogeneity of RF pulses applied to the tissue.

The UTE AFI procedure includes producing a longitudinal magnetization mapping function to correct RF field inhomogeneity and low excitation efficiency for T1 measurements, such as using a VTR method. In some implementations, for example a technique for producing the longitudinal magnetization mapping function, which can be used for correcting RF field inhomogeneity and low excitation efficiency, includes using an interleaved ultrashort echo time (UTE) acquisition protocol with two different relaxation time parameters (TRs), e.g., TR1=20 ms, TR2=100 ms, and two different areas of gradient crushers in TR1 and TR2 (e.g., 180 and 900 mT·ms/m, respectively). For example, a gradient crusher can add an extra $B_0$ magnetic field which is spatially linear to "crush" the transversal magnetizations after data acquisition in each TR. The larger gradient area, the better transversal magnetizations crushing. The resultant two sets of data can be used to determine longitudinal magnetization mapping function for both short and long T2 tissues. Furthermore, the procedure can further determine the B1 scaling factor ($B_{1s}$) for long T2 tissues, which is obtained by dividing a measured flip angle α by the nominal flip angle $α_{norm}$, i.e., $B_{1s}=α/α_{norm}$. When $B_{1s}=1$, then this means there is a uniform RF field.

Figure 2B:
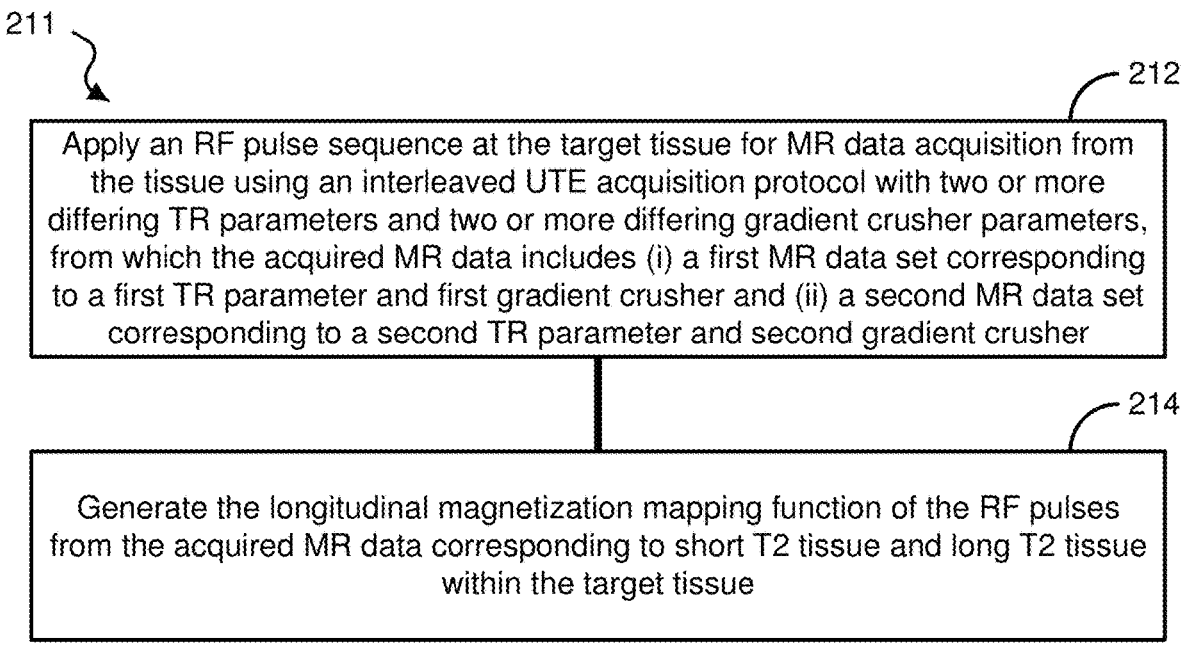

FIG. 2B shows a diagram depicting an example embodiment of an ultrashort echo time actual flip angle imaging (UTE AFI) procedure 211 implemented in the process 210. As shown in FIG. 2B, the UTE AFI procedure 211 includes, at process 212, applying an RF pulse sequence for MR data acquisition from the target tissue using an interleaved UTE acquisition protocol on the target tissue with two or more differing TR parameters and two or more differing gradient crushers. As such, the acquired MR data includes the acquired MR data includes (i) a first MR data set corresponding to a first TR parameter and first gradient crusher and (ii) a second MR data set corresponding to a second TR parameter and second gradient crusher. The first MR data set and the second MR data set are used to generate a longitudinal magnetization mapping function for short T2 tissue and long T2 tissue of the overall tissue of the process 210.

In some implementations, the two or more differing TR parameters can include a first TR parameter (TR1) in a range of 5 ms to 50 ms, and a second TR parameter (TR2) in a range of 25 ms to 400 ms; and the two or more differing gradient crusher (GC) parameters can include a first gradient crusher parameter corresponding to TR1 of 5 mT·ms/m to 500 mT·ms/m, and a second gradient crusher parameter corresponding to TR2 of 250 mT·ms/m to 2500 mT·ms/m.

The UTE AFI procedure 211 includes, at process 214, generating a longitudinal magnetization mapping function including RF inhomogeneity and excitation efficiency from the acquired first and second MR data sets associated with short T2 tissue and long T2 tissue within the target tissue. For example, the longitudinal magnetization mapping function can include determining the B1 scaling factor ($B_{1s}$) by dividing a measured flip angle $\alpha$ by the nominal flip angle $\alpha_{norm}$ for the applied RF pulses for long T2 tissues in the process 212. The generated longitudinal magnetization mapping function thereby provides information of both RF inhomogeneity and excitation efficiency for the target tissue that can be used to correct the T1 measurements.

Referring back to FIG. 2A, the method 200 includes a process 220 to apply a T1 mapping for the short T2 tissue region and the long T2 tissue region using a variable repetition time (VTR) fitting procedure to produce a T1 measurement associated with at least a portion of the short T2 tissue region and/or the long T2 tissue region.

For long T2 tissues, VTR data are processed with the actual flip angles, which can be calculated by applying the B1 scaling factor ($B_{1s}$) to the nominal flip angles. Yet, for short T2 tissues, it is complicated to measure the B1 scaling factor. Therefore, the method 200 provides a new technique for producing T1 measurements which utilizes a UTE-AFI method to produce the longitudinal magnetization mapping function (as described above in the process 210) and a UTE VTR method (at process 220) to calculate T1, regardless of short or long T2 tissue type, and which employs identical RF excitation pulses.

FIG. 2C shows a diagram depicting an example embodiment of a variable repetition time (VTR) fitting procedure 221 implemented in the process 220. In implementations of the process 220, for example, the VTR fitting procedure 221 includes, at 222, assigning the longitudinal magnetization mapping function induced by the applied RF pulse, e.g., $f_{z,s}(\alpha, \tau, T_2)$, an identical longitudinal mapping function as $$f_z(\alpha, \tau, T_2) \approx \frac{m-1}{n-r},$$

where r is the signal ratio of the first MR data set and second MR data set ($S_1/S_2$), and n is the ratio of TR1/TR2. The VTR fitting procedure 221 includes, at 224, combining the magnetization in thermal equivalent coefficient ($M_0$) and the transversal mapping function $f_{xy,s}(\alpha, \tau, T_2)$ into a single unknown parameter (e.g., g), since $M_0$ and $f_{xy,s}(\alpha, \tau, T_2)$ are not functions of TR. The VTR fitting procedure 221 includes, at 226, determining T1 by fitting the acquired MR data with variable TR values, which results in producing robust T1 measurement values for both short and long T2 tissues. For example, VTR data acquired from the UTE sequence, e.g., with a spoiled gradient-like sequence, can be fit into:

$$S_{spgr} = g \frac{1-E}{1-Ef_{z,s}(\alpha, \tau, T_2)},$$

where $i = \exp(-TR_s/T_1)$, and where $TR_s$ is the repetition time of the UTE sequence. In the process 226, there are only two unknown parameters in the fitting equation, i.e., $T_1$ and $g$ ($=M_0 f_{xy,s}(\alpha, \tau, T_2)$), since $f_{z,s}(\alpha, \tau, T_2)$ is obtained from UTE-AFI technique at the process 210 and assigned with data in the process 222. In implementations of the process 226, the Levenberg-Marquardt algorithm can be used for the VTR fitting to estimate T1.

Referring back to FIG. 2A, the method 200 includes an optional process 230 to produce an image that provides the T1 measurements with respect to the tissue indicative of the, at least portion of, short T2 tissue region of the tissue. In some implementations of the process 230, the image can include T1 measurements of at least a portion of the long T2 tissue, and/or other types of tissue parameters. The method 200 includes producing an output of the T1 measurements that can include various formats, including as data files, images, or other forms.

Example Implementations

Described below are techniques employed and results obtained from example implementations of the system 100 and method 200, including numerical simulations, phantom studies, and in vivo experimental implementations that demonstrate the example 3D UTE-Cones AFI-VTR technique provides more accurate T1 measurements than both B1 uncorrected VTR/VFA and B1 corrected VFA methods for short T2 tissues. In the example implementations, T1 measurements produced by the example 3D UTE-Cones AFI-VTR method included a mean T1 of 240.0±24.6 ms for bovine cortical bone and 217.7±10.3 ms for tibial midshaft of human volunteers, respectively.

FIGS. 3A-3D show diagrams depicting conventional 3D UTE-Cones with a single TR and dual-TR pulse sequences (FIGS. 3A and 3B, respectively), UTE-Cones AFI sequences for T1 measurements, 3D spiral sampling with a minimal nominal TE, and spiral trajectories arranged with conical view ordering (FIGS. 3C and 3D, respectively). Actual flip angle mapping was achieved with the 3D dual-TR UTE-Cones sequence. A series of conventional 3D UTE-Cones sequences with variable TRs or variable flip angles were used for T1 measurement. For example, a conventional UTE-Cones sequence was used for T1 measurement by VFA or VTR methods in the example implementations. Signals are acquired during the each two interleaved TRs in the 3D UTE-Cones AFI sequence. For both UTE-Cones AFI and UTE-Cones sequences, a short rectangular pulse (such as 150 µs) was used for non-selective signal excitation, shown in FIG. 3C, with an echo time around 32 µs, followed by a 3D spiral trajectory data acquisition with conical view ordering, shown in FIG. 3D.

The steady state signals S1 and S2 acquired in TR1 and TR2 of the 3D UTE-Cones AFI sequence can be expressed as follows:

$$S_1 = M_0 f_{xy}(\alpha, \tau, T_2) \frac{1 - E_2 + (1 - E_1)E_2 f_z(\alpha, \tau, T_2)}{1 - E_1 E_2 f_z^2(\alpha, \tau, T_2)} \quad [1]$$

$$S_2 = M_0 f_{xy}(\alpha, \tau, T_2) \frac{1 - E_1 + (1 - E_2)E_1 f_z(\alpha, \tau, T_2)}{1 - E_1 E_2 f_z^2(\alpha, \tau, T_2)} \quad [2]$$

with
$E_1 = \exp(-TR_1/T_1)$,
$E_2 = \exp(-TR_2/T_1)$.

$M_0$ is the magnetization in thermal equivalent. $f_{xy}(\alpha, \tau, T_2)$ and $f_z(\alpha, \tau, T_2)$ are the transversal and longitudinal magnetization mapping functions induced by a RF pulse, which are defined as $f_{xy}(\alpha, \tau, T_2) = M_{xy}/M_0$ and $f_z(\alpha, \tau, T_2) = M_z/M_0$ respectively. $\alpha$ and $\tau$ are the flip angle and the duration of the rectangular excitation pulse, respectively. Since the RF duration is much shorter than the tissue T1, T1 relaxation during the excitation is neglected in the mapping functions.

For short T2 tissues with T2 values on the same order of $\tau$, $f_{xy}(\alpha, \tau, T_2)$ and $f_z(\alpha, \tau, T_2)$ are determined not only by $\alpha$ but also $\tau$ and tissue $T_2$, whose analytical expressions can be found as follows:

$$f_{xy}(\alpha, \tau, T_2) = e^{-\frac{\tau}{2T_2}} \alpha \operatorname{sinc}\left(\sqrt{\alpha^2 - \left(\frac{\tau}{2T_2}\right)^2}\right) \quad [3]$$

$$f_z(\alpha, \tau, T_2) = e^{-\frac{\tau}{2T_2}}\left(\cos\left(\sqrt{\alpha^2 - \left(\frac{\tau}{2T_2}\right)^2}\right) + \frac{\tau}{2T_2}\operatorname{sinc}\left(\sqrt{\alpha^2 - \left(\frac{\tau}{2T_2}\right)^2}\right)\right) \quad [4]$$

On the other hand, for long T2 tissues with T2s>>$\tau$, $f_{xy}(\alpha, \tau, T_2)$ and $f_z(\alpha, \tau, T_2)$ can be simplified as $\sin(\alpha)$ and $\cos(\alpha)$, respectively. Eqs. [1] and [2] will be identical to the conventional AFI in Eq. [3].

The general AFI method relies on two fundamental assumptions: (1) complete spoiling of the transverse magnetization in TR1 and TR2; (2) sufficiently short TR1 and TR2 as compared to T1. Perfect spoiling in each TR is very difficult since a high flip angle and relatively short TRs are used in AFI. For example, it is suggested that an optimal combination of RF spoiling and an extremely heavy gradient crusher pairs for spoiling). However, due to the fast decay of the transverse magnetizations for short T2 tissues, the heavy gradient spoiler may not be necessary for complete spoiling. With short TRs relative to T1, the signal ratio r of S1 and S2 can be simplified with a first-order approximation to the exponential terms:

$$r = S_2/S_1 \approx \frac{1 + nf_z(\alpha, \tau, T_2)}{n + f_z(\alpha, \tau, T_2)} \quad [5]$$

where n=TR2/TR1. Thus, the ratio r can be used as a T1 independent measure of $f_z(\alpha, \tau, T_2)$:

$$f_z(\alpha, \tau, T_2) \approx \frac{rn - 1}{n - r} \quad [6]$$

For a tissue with T2>>$\tau$, $f_{xy}(\alpha, \tau, T_2)$ and $f_z(\alpha, \tau, T_2)$ simplify to $\sin(\alpha)$ and $\cos(\alpha)$, respectively. For example, for long T2 tissues, $f_z(\alpha, \tau, T_2)$ becomes $\cos(\alpha)$. So the actual flip angle $\alpha$ can be estimated with the following equation:

$$\alpha \approx \arccos\left(\frac{rn - 1}{n - r}\right) \quad [7]$$

Then the B1 scaling factor (B1s) is obtained by dividing the measured $\alpha$ by the nominal flip angle $\alpha_{norm}$, which is expressed as follows:

$$B_{1s} = \alpha/\alpha_{norm} \quad [8]$$

$B_{1s}$ is used to quantify the RF inhomogeneity. For example, $B_{1s}=1$ means a uniform RF field.

For short T2 tissues, the measurement of $\alpha$ or B1s is more complicated. With the knowledge of RF duration and tissue T2, $\alpha$ can be calculated from the analytical expression of $f_z(\alpha, \tau, T_2)$ or through the Bloch simulation. However, it is very challenging to measure short T2 relaxations using typical spin echo or CPMG method due to the fast signal decay and RF peak power limitation especially for clinical scanners. Furthermore, it will take extra scan time for T2 calculation which may suffer from errors caused by magnetization transfer effects and limited signal to noise ratio (SNR) typically associated with imaging of short T2 tissues. To cope with those challenges, disclosed is a new approach to avoid calculating $\alpha$ unlike previous studies. The obtained $f_z(\alpha, \tau, T_2)$ can be directly used as an input for T1 measurement with the VTR method (details below).

The 3D UTE-Cones sequence is one type of SPGR sequences with an ultrashort echo time around 32 µs and a 3D non-Cartesian center-out k-space encoding scheme. The signals acquired with a SPGR like sequence is expressed as follows:

$$S_{spgr} = M_0 f_{xy,s}(\alpha, \tau, T_2) \frac{1 - E}{1 - E f_{z,s}(\alpha, \tau, T_2)} \quad [9]$$

with $E = \exp(-TR_s/T_1)$.

$TR_s$ is the repetition time of the UTE-Cones sequence. $f_{xy,s}(\alpha, \tau, T_2)$ and $f_{z,s}(\alpha, \tau, T_2)$ are the RF pulse induced transversal and longitudinal mapping functions, respectively. Similar to $f_{xy}(\alpha, \tau, T_2)$ and $f_z(\alpha, \tau, T_2)$ in Eqs. [1] and [2], $f_{xy,s}(\alpha, \tau, T_2)$ and $f_{z,s}(\alpha, \tau, T_2)$ also become the conventional $\sin(\alpha)$ and $\cos(\alpha)$ for the long T2 tissues.

Fitting of Eq. [9] can be used for T1 quantification of short T2 tissues from the VTR or VFA UTE-Cones data. For long T2 tissues, VTR or VFA data are processed with the actual flip angles, which can be calculated by applying the B1 scaling factor to the nominal flip angles. For example, since it is complicated to measure the B1 scaling factor for short T2 tissues, disclosed is a new T1 measurement technique by combining UTE-AFI and UTE VTR methods where the same RF excitation pulses are used. For example, as a result, $f_{z,s}(\alpha, \tau, T_2)$ in Eq. [9] is identical to $f_z(\alpha, \tau, T_2)$ in Eq. [6]. In the T1 fitting procedure with the VTR method, the coefficient $M_0 f_{xy,s}(\alpha, \tau, T_2)$ in Eq. [6] can be combined into a single unknown parameter (e.g., g), since $M_0 f_{xy,s}(\alpha, \tau, T_2)$ is not a function of TR. After the measured $f_z(\alpha, \tau, T_2)$ been substituted into Eq. [6], there are only two unknown parameters including g and T1. So at least two different TRs are required for robust T1 fitting.

Example Methods

In the example implementations, the 3D UTE-Cones AFI and conventional UTE-Cones sequences (e.g., shown in FIGS. 3A-3D) were implemented on a 3T Signa TwinSpeed scanner (GE Healthcare Technologies, Milwaukee, Wis.). An 8-channel transmit/receive knee coil was used for both RF transmission and signal reception. The sequences used unique k-space trajectories that sampled data along evenly spaced twisting paths in the shape of multiple cones. Data sampling started from the center of k-space and twisted outwards. Data acquisition started as soon as possible after the RF excitation with a minimal nominal echo time of 32 µs. Both RF and gradient spoiling were used to crush the remaining transverse magnetizations. In 3D UTE-Cones AFI, the areas of gradient crushers in TR1 and TR2 were 180 and 900 mT·ms/m respectively and the RF phase increment was 39°. In 3D VTR or VFA UTE-Cones, the area of gradient crushers was 180 mT·ms/m and the RF phase increment was 169°. The 3D UTE-Cones sequence allows for anisotropic resolution (e.g., high in-plane resolution and thicker slices) for much improved SNR and reduced scan time relative to isotropic imaging.

Example Simulation

Numerical simulations were performed to investigate the accuracy of example T1 measurement for short T2 tissues in accordance with methods of the present technology. The same rectangular RF pulses were used for signal excitation in both 3D UTE-Cones AFI and VTR sequences with a duration from 0.1 to 500 μs. T2 values of simulated short T2 tissues ranged from 0 to 1 ms with the same T1 value set to 500 ms. The sequence parameters for the 3D UTE-Cones AFI and VTR sequences were shown as follows. (1) 3D UTE-Cones AFI: TR1/TR2=20/100 ms and flip angle=45°; (2) VTR UTE-Cones: TR=10, 50, 100, 150 and 200 ms and flip angle=45°. For comparison, VFA UTE-Cones was also used for T1 measurement with the following sequence parameters: TR=20 ms and flip angles=7°, 14°, 22°, 30° and 38°. Three simulated B1 scaling factors were set to 0.8, 1 and 1.2.

Example Phantom and Sample Study

An agarose phantom was made by adding 3 g agarose powder and 7.2 mg $MnCl_2 \cdot 4H_2O$ crystal to 400 mL distilled water. After heating to boil by a microwave oven and then cooling down within a refrigerator, the agarose solution became gel state. From experience, for example, the T2 value of the agarose phantom was selected around 80 ms which was used to simulate the long T2 tissue. Another agarose-bone phantom was made by mixing 300 mL distilled water with the same concentrations of agarose and $MnCl_2$ as in the above phantom. After heating and cooling down to around 40°, a fresh bovine cortical bone sample was suspended in the center of the solution. Then the phantom was kept cooling down until the solution became a gel.

The two phantoms were both scanned with the 3D UTE-Cones AFI, VTR and VFA sequences, respectively, with the same FOVs of 15×15×12.8 $cm^3$, acquisition matrixes of 128×128×32 and bandwidth of 125 kHz. Other sequence parameters were listed as follows: 1) 3D UTE-Cones AFI: TR1/TR2=20/100 ms, flip angle=45° and a total scan time of 8 min 55 sec; 2) 3D VTR UTE-Cones: TR=20, 40, 60, 80 and 120 ms, flip angle=45° and a total scan time of 21 min 20 sec; 3) 3D VFA UTE-Cones: TR=24 ms, flip angle=8°, 16°, 26° and 45° and a total scan time of 7 min 8 sec.

A bovine cortical bone sample was used to compare the two VTR T1 measurement techniques with two different excitation flip angles of 20° and 45°, whose RF durations were 60 μs and 150 μs respectively. The peak powers of the two RF pulses are both near the maximum power provided on our scanner. The UTE-Cones AFI method was used to generate mapping function $f_z(\alpha, \tau, T_2)$ to correct T1 measurement errors induced by both B1 inhomogeneity and the imperfect excitation of the 45° pulse. The 20° pulse with a duration of 60 μs was more effective for short T2 excitation, as the pulse duration is much shorter than the typical T2* value of around 300 μs for bovine cortical bone. So the error in T1 measurement with a 20° pulse was expected to be mainly from B1 inhomogeneity. The same FOVs of 15×15×6.4 $cm^3$, acquisition matrixes of 128×128×16 and bandwidth of 125 kHz were used for the three sequences. Other sequence parameters were listed as follows. (1) 3D UTE-Cones AFI: TR1/TR2=20/100 ms, flip angle=45° and a total scan time of 4 min 40 sec; (2) 3D VTR UTE-Cones: TR=15, 30, 50 and 80 ms, flip angle=45° and a total scan time of 6 min 41 sec; (3) 3D VTR UTE-Cones: TR=15, 30, 50 and 80 ms, flip angle=20° and a total scan time of 6 min 41 sec.

Another bovine cortical bone sample was used to investigate the T1 measurement accuracy of the 3D UTE-Cones AFI-VTR method using different RF pulse durations: 150 μs, 200 μs and 300 μs. Identical excitation pulses were used for the UTE-Cones AFI and VTR sequences. The two sequences were repeatedly scanned three times using different RF excitation pulses mentioned above. The same FOVs of 15×15×6.4 $cm^3$, acquisition matrixes of 128×128×16 and bandwidth of 125 kHz were used for the two sequences. Other sequence parameters were listed as follows. (1) 3D UTE-Cones AFI: TR1/TR2=20/100 ms, flip angle=45° and a total scan time of 4 min 40 sec; (2) 3D VTR UTE-Cones: TR=15, 30, 50 and 80 ms, flip angle=45° and a total scan time of 7 min 10 sec.

Example In Vivo Study

The 3D UTE-Cones AFI-VTR method was tested in vivo on three healthy male volunteers (29, 35 and 40 years old, respectively). Informed consent was obtained from all subjects in accordance with guidelines of the institutional review board. Sequence parameters were listed as follows. (1) 3D UTE-Cones AFI: FOV=15×15×16.8 $cm^3$, acquisition matrixes=128×128×24, bandwidth=250 kHz, TR1/TR2=20/100 ms, flip angle=45° and scan time of 7 min 05 sec; (2) 3D VTR UTE-Cones: FOV=15×15×16.8 $cm^3$, acquisition matrixes=160×160×24, bandwidth=250 kHz, TR=15, 30, 50 and 80 ms, flip angle=45° and scan time of 12 min 24 sec.

Example Data Analysis

The Levenberg-Marquardt algorithm was used to solve the non-linear fitting of Eq. [8] for both VTR and VFA methods. The analysis algorithms were written in Matlab (e.g., The MathWorks Inc., Natick, Mass., USA) and were executed offline on the DICOM images obtained by the 3D UTE-Cones AFI and VTR/VFA UTE-Cones protocols described above. For each fitting, B1 scaling factor, $f_z(\alpha, \tau, T_2)$ and T1 maps were displayed. Mean and standard deviation of $T_1$ values for both bovine cortical bone (e.g., total 6 samples) and in vivo cortical bone in the tibial midshaft (e.g., 3 volunteers) were also reported.

Example Results

Figure 4:
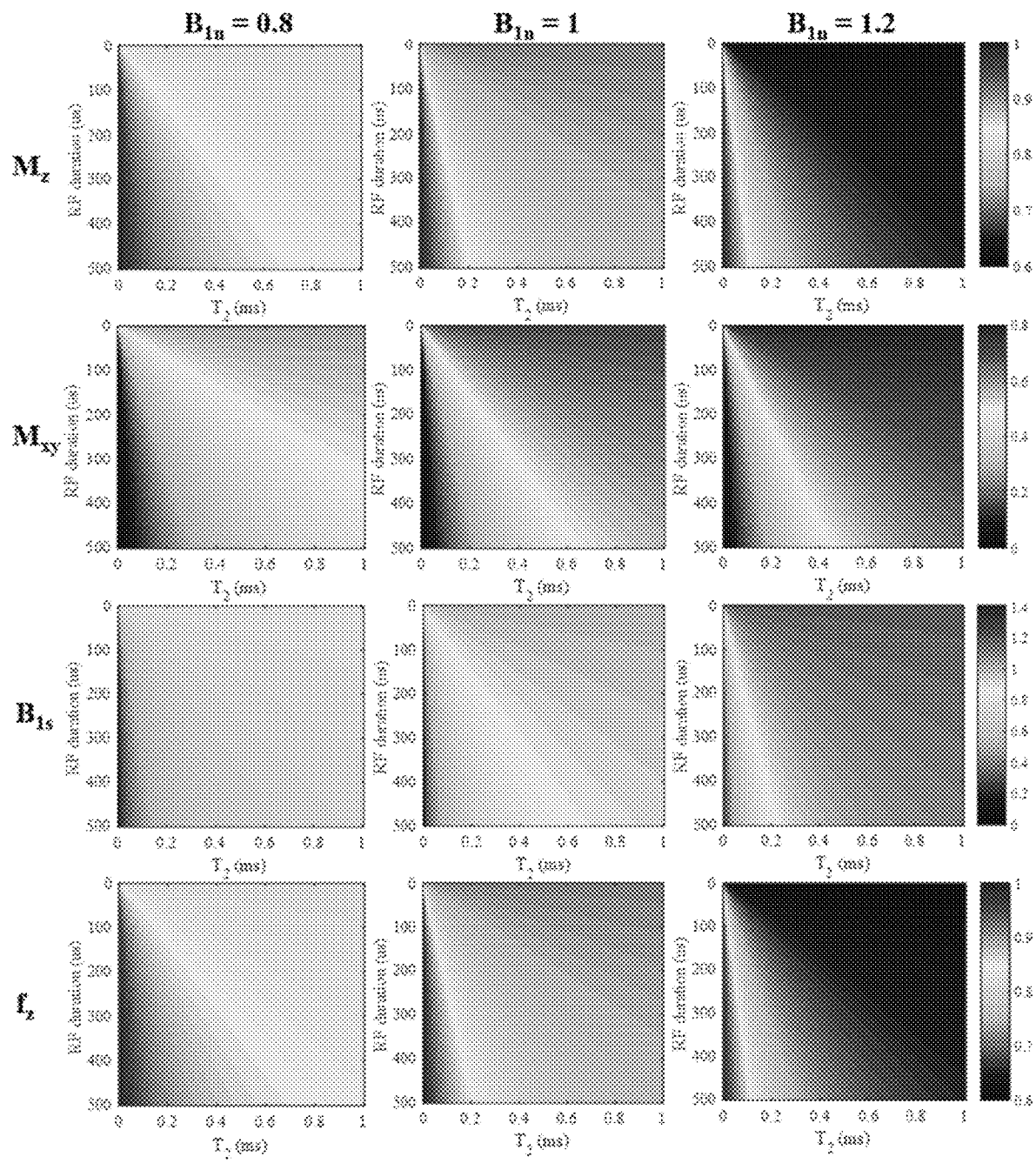
FIG. 4 shows image plots of example simulation results for short T2 tissues with a hard RF pulse excitation.

FIG. 4 shows image plots of example simulation results for short T2 tissues (T2 ranged from 0 to 1 ms) with a hard RF pulse excitation (duration ranged from 0 to 500 μs). The images in the first two rows are longitudinal and transversal magnetizations (e. $f_z(\alpha, \tau, T_2)$ and $f_{xy}(\alpha, \tau, T_2)$, respectively) calculated by Eqs. [3] and [4]. The third and fourth rows are the corresponding B1 scaling factors and mapping function $f_z(\alpha, \tau, T_2)$ obtained by AFI method. The first to third columns are simulation results with nominal B1 (B1n) values of 0.8, 1 and 1.2.

The first two rows in FIG. 4 show example simulation results of the theoretical longitudinal ($M_z$) and transversal ($M_{xy}$) magnetizations generated by the rectangular RF pulses with variable durations for a series of short T2s. In practice, for example, $M_z$ and $M_{xy}$ are $f_z(\alpha, \tau, T_2)$ and $f_{xy}(\alpha, \tau, T_2)$ which can be calculated by Eqs. [3] and [4], respectively. To image short T2 species, longer RF pulses are less effective for signal excitation. On the other hand, a shorter T2 species is much harder to be effectively excited than a longer one. In addition, a smaller $M_z$ or larger $M_{xy}$ is generated by the excitation pulse with an increasing nominal B1 scaling factor from 0.8 to 1.2. The last two rows in FIG. 4 show the estimated B1 scaling factors and $f_z(\alpha, \tau, T_2)$ by the AFI method, which were calculated by Eq. [8] and [6] respectively. The measured B1 scaling factors are more accurate when using a shorter RF pulse for excitation or imaging a longer T2 species. Otherwise, the estimated B1 scaling factors will be smaller than the nominal values. The measured $f_z(\alpha, \tau, T_2)$ is almost identical to the theoretical $f_z(\alpha, \tau, T_2)$ (i.e. $M_z$), which demonstrates the accuracy of the AFI technique.

Figure 5:
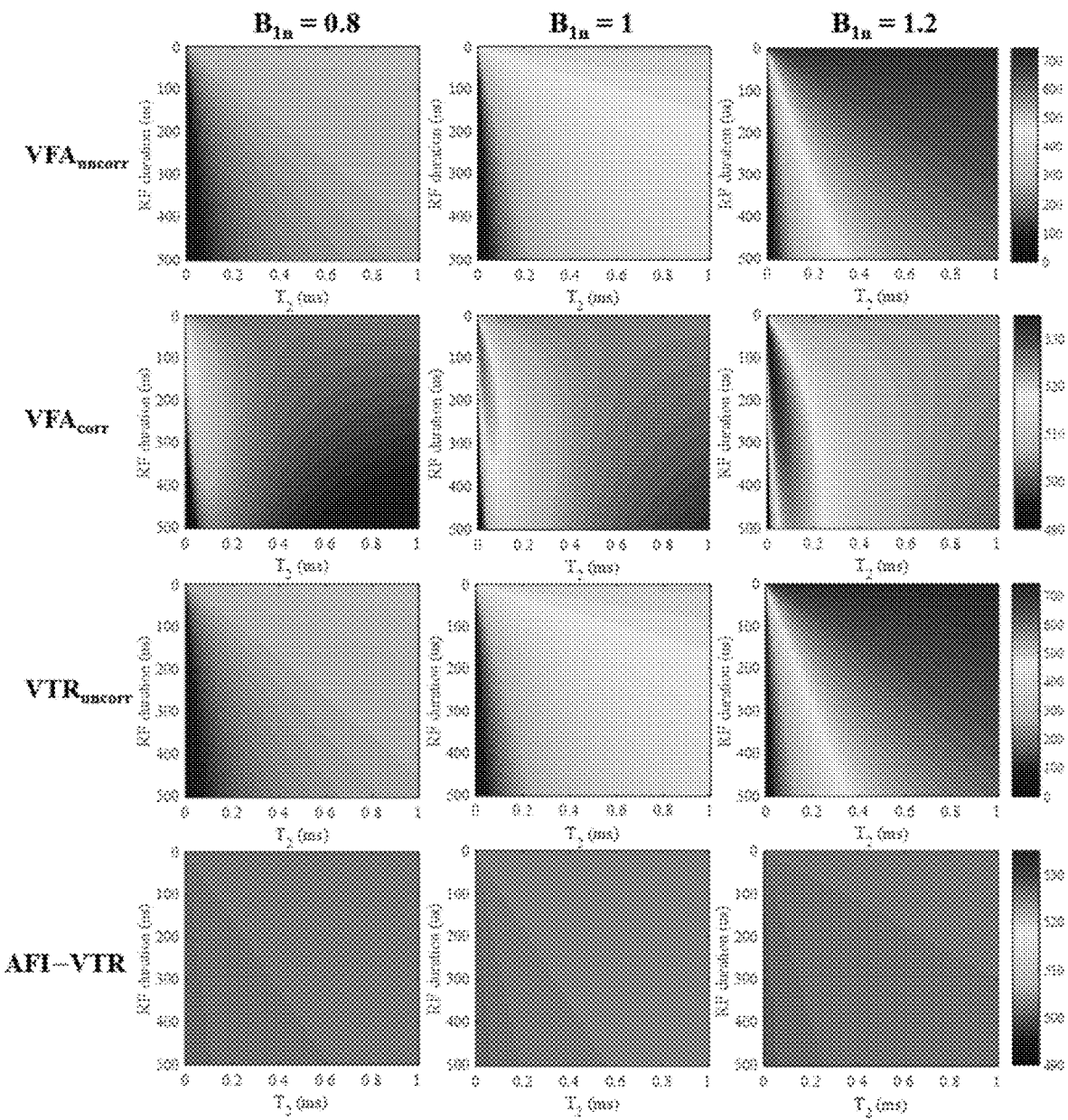
FIG. 5 shows image plots of example T1 mapping results generated by example VFA and VTR methods.

FIG. 5 shows image plots of example T1 mapping results generated by both VFA and VTR methods. The first and third rows are VFA and VTR T1 maps without B1 correction. The second and fourth rows are B1 corrected VFA and AFI-VTR T1 maps respectively. The first to third columns are simulation results with nominal B1 values of 0.8, 1 and 1.2.

As shown in FIG. 5, the example simulation results of T1 measurement were obtained using both VFA and VTR methods with and without AFI correction. As shown in the bottom left cornels of all the images in the first and third rows, T1s from both uncorrected VFA and VTR are subject to underestimation caused by the imperfect excitation when using a longer RF pulse for excitation or imaging a shorter T2 species. Besides, the estimated T1 values increase with lager nominal B1 scaling factors. The second row are the VFA results using the conventional B1 correction method for the long T2 tissues. The B1 maps used for correction can be found in the third row of FIG. 4. Overall, the corrected VFA T1s are more accurate than the uncorrected ones. However, T1 estimation errors still exist especially for the tissues with a T2 lower than 0.4 ms and the errors are getting larger with increased B1 inhomogeneity. In contrast, the example AFI-VTR T1 measurements shown in the last row are nearly accurate for all short T2s no matter how long the excitation pulses are. Besides, identical T1 values are also obtained with different B1 scaling factors. So the example T1 measurement method of the present technology using the AFI-VTR can eliminate errors induced by B1 inhomogeneity and it is also immune to the imperfect signal excitation for short T2 species.

Figure 6:
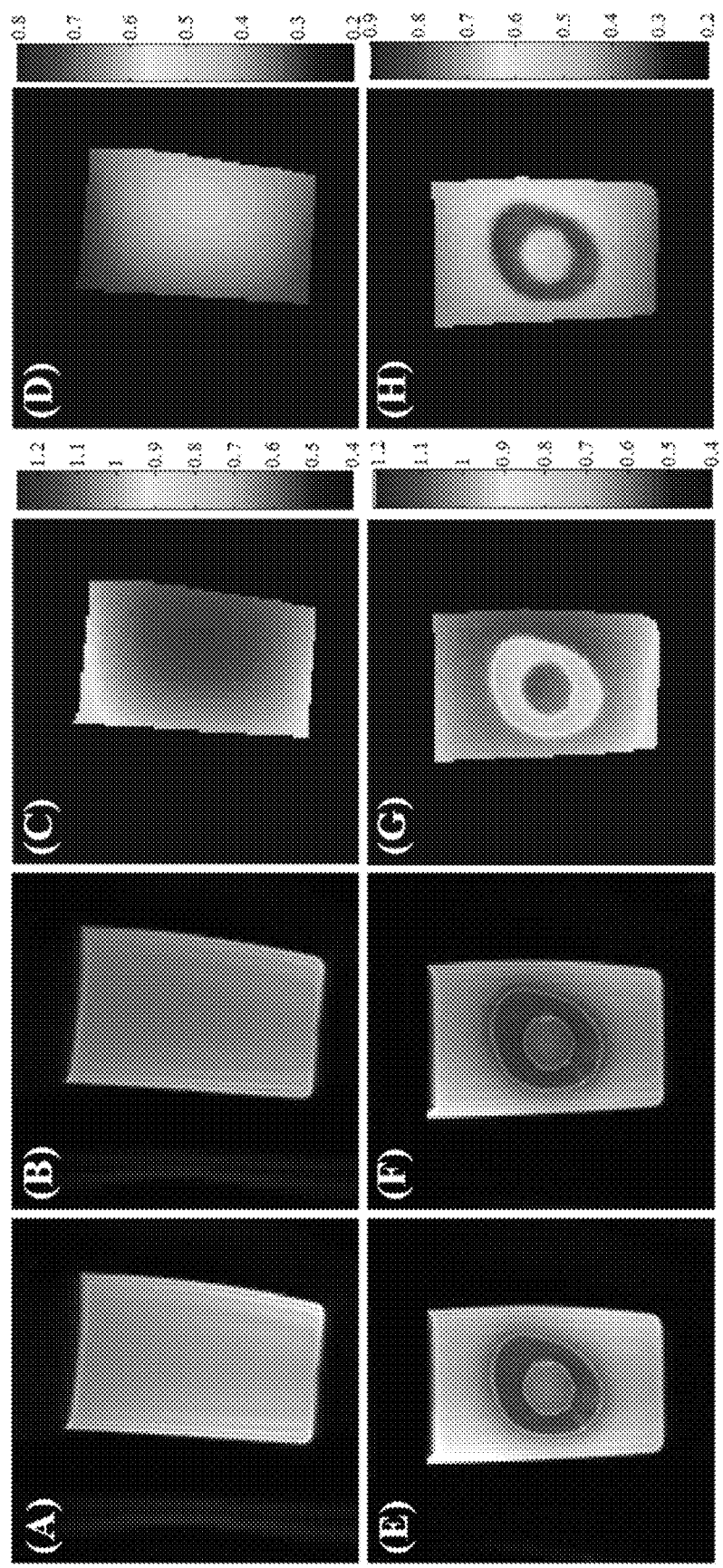
FIG. 6 shows a diagram of images showing example phantom results obtained from implementation of an example 3D UTE-Cones-AFI method.

FIG. 6 shows a diagram of images showing example phantom results of 3D UTE-Cones-AFI. B1 maps (image C) and $f_z$ (image D) of agarose phantom generated from the dual-TR Cones images A and B. B1 maps (image G) and $f_z$ (image H) maps of agarose-bone phantom generated from the dual-TR Cones images E and F.

As shown in FIG. 6 images C and D, both measured B1 inhomogeneity (calculated by Eqs. [7] and [8]) and $f_z(\alpha, \tau, T_2)$ maps (calculated by Eq. [6]) of the agarose phantom exhibited a continuous spatial distribution. High flip angles tended to appear in the center area of the knee coil. Similar results were found in the pure agarose region of the agarose-bone phantom as shown in FIG. 6 images G and H. However, there existed clear boundaries between bone and agarose regions in the B1 scaling factor and $f_z(\alpha, \tau, T_2)$ maps. The measured B1 scaling factors in the bone region were lower than those in the agarose region due to the excitation inefficiency for the cortical bone. The experimental results are identical to the simulation results in FIG. 4.

Thus, the non-continuous B1 map demonstrated the inaccuracy of B1 measurement for cortical bone. However, $f_z(\alpha, \tau, T_2)$ values in the bone region were still accurate.

Figure 7:
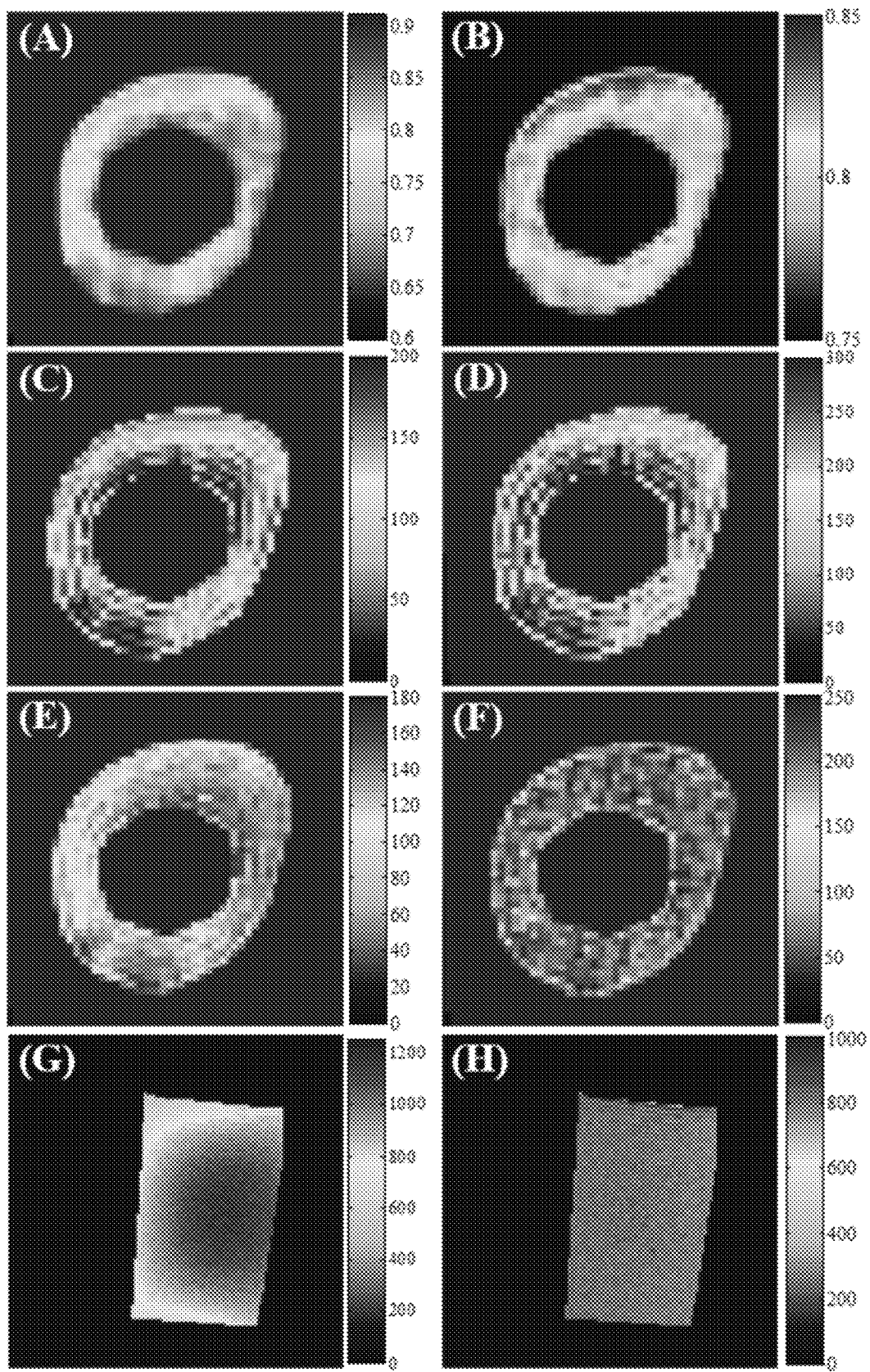
FIG. 7 shows example phantom T1 maps using example 3D UTE-Cones VFA and VTR based methods.

FIG. 7 shows example phantom T1 maps using 3D UTE-Cones VFA and VTR based methods. Extracted B1 maps (image A) and $f_z$ (image B) in the bone region of agarose-bone phantom as shown in FIG. 6 images E and F. Bone T1 maps from C to F are obtained by VFA without B1 correction (image C), VFA with B1 correction (image D), VTR without B1 correction (image E) and the example AFI-VTR method (image F), respectively. Images G and H show the example T1 maps of the agarose phantom as shown in FIG. 5 images A and B without and with B1 correction respectively.

Example T1 measurements for the phantoms are shown in FIG. 7. For example, both the B1 inhomogeneity and excitation inefficiency lead to complicated B1 and $f_z(\alpha, \tau, T_2)$ distributions in the bone region of the agarose-bone phantom. The VFA T1 map in the bone region still suffered signal inhomogeneity even with B1 correction. In contrast, the bone T1 map measured by the example UTE-Cones AFI-TR method was much more uniform than the VFA T1 map and the uncorrected VTR T1 map. For the long T2 agarose phantom, the T1 map obtained by the UTE-Cones AFI-VTR method was also much more uniform than the uncorrected VTR T1 map. The example results demonstrate that the UTE-Cones AFI-VTR method can get accurate T1 measurement for both short and long T2 tissues.

Figure 8:
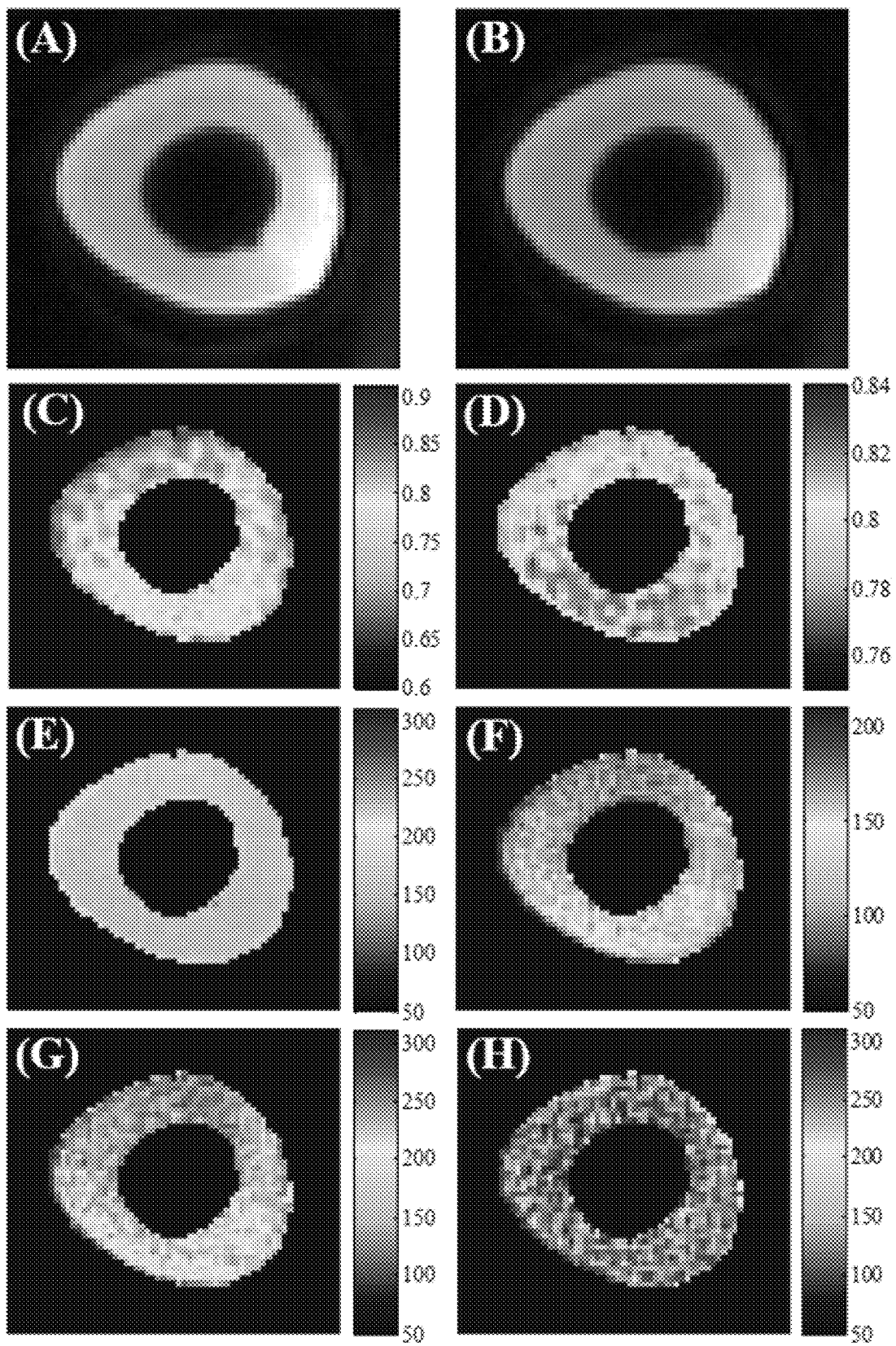
FIG. 8 shows data plots of example results of bovine cortical bone T1 measurements.

FIG. 8 shows data plots of example results of bovine cortical bone T1 measurements. B1 maps (image C) and $f_z$ maps (image D) are calculated from 3D UTE-Cones dual-TR images (images A and B). Images E and F are the T1 maps displayed with different color bar ranges measured by VTR method without B1 correction. The RF duration of the used excitation pulse is 150 μs and the flip angle is 45°. Image H is the T1 maps measured by 3D UTE-Cones AFI-VTR. Image G is the T1 maps generated by VTR method without B1 correction using a RF with a duration of 60 μs and the flip angle of 20°.

FIG. 8 shows the bovine cortical bone T1 measurements using the example UTE-Cones AFI-VTR method (with an excitation pulse of 45° and 150 μs in duration) and conventional VTR method (with an excitation pulse of 20° and 60 μs in duration). As shown in images E and G of FIG. 8, with the same color bar range, the T1 map measured with the conventional VTR method has a higher average value than the T1 map measured with the example method before $f_z(\alpha, \tau, T_2)$ correction because of the higher excitation efficiency. Image F of FIG. 8 is the same T1 measurement as image E, which was displayed with a smaller color bar range for better comparison with image G. The same color distribution can be found in images F and G, which demonstrated that they had the same B1 inhomogeneity modulation. The example results demonstrate that T1 measurements using a RF pulse with a less excitation efficiency will underestimate the T1 values without affecting the B1 inhomogeneity modulation. Image H of FIG. 8 is the T1 map measured with the example UTE-Cones AFI-VTR method. Image H of FIG. 8 was more uniform than image G of FIG. 8, e.g., demonstrating that the example UTE-Cones AFI-VTR T1 measurement method can correct both B1 inhomogeneity and excitation inefficiency.

Figure 9:
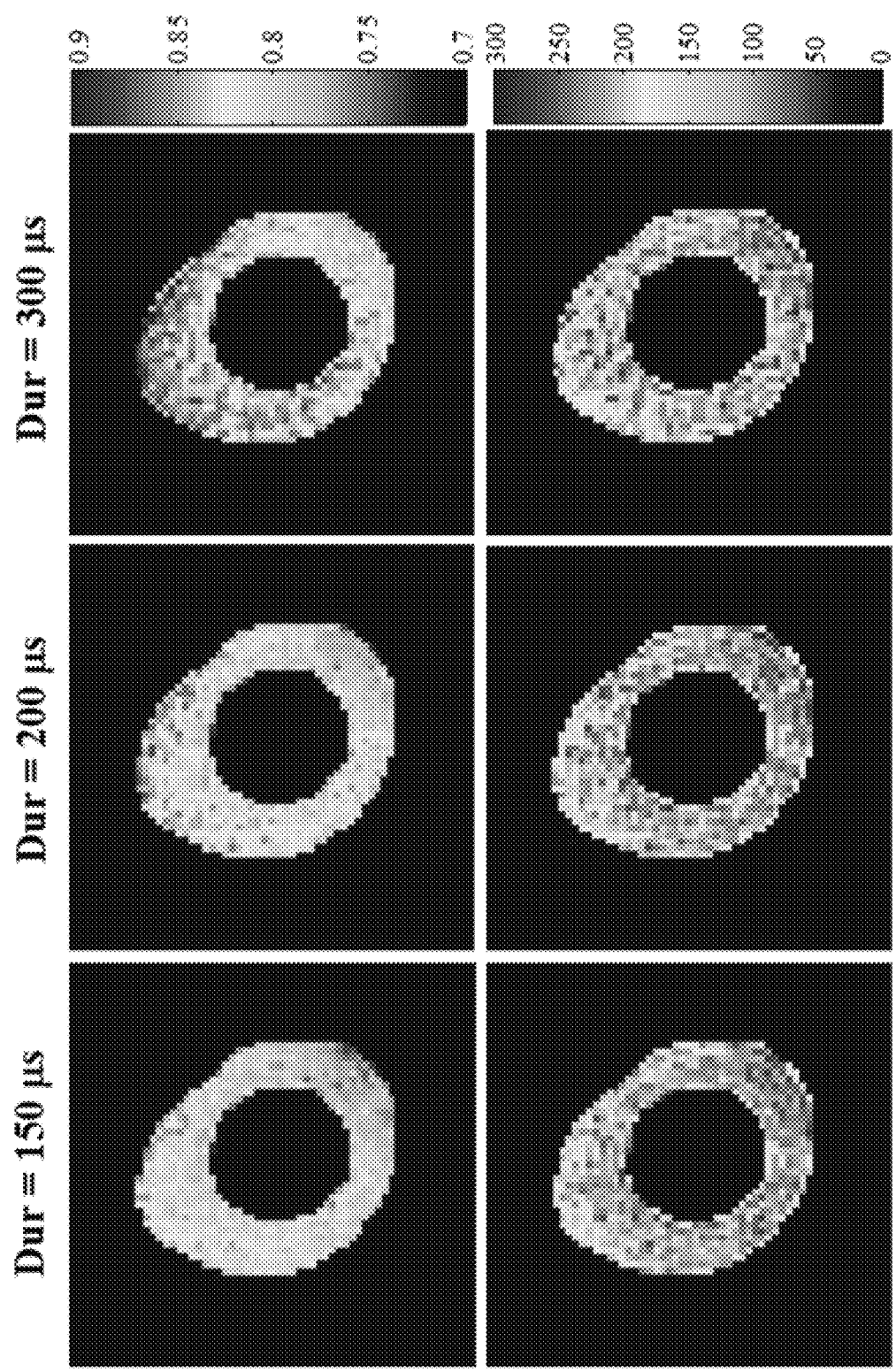
FIG. 9 shows data plots of example bovine cortical bone results using an example embodiment of the 3D UTE-Cones AFI-VTR method with different RF durations.

FIG. 9 shows data plots of example bovine cortical bone results using an example embodiment of the 3D UTE-Cones AFI-VTR method with different RF durations (same flip angle of 45°). The first rows are $f_z$ maps generated from the example 3D UTE-Cones AFI method. The second rows are the 3D UTE-Cones AFI-VTR T1 maps.

The data plots shown in FIG. 9 show the effects of RF duration on T1 measurement of bovine cortical bone using the example UTE-Cones AFI-VTR method. The mapping $f_z(\alpha, \tau, T_2)$ values increased with the longer RF duration, which is consistent with the simulation results in FIG. 4. However, the measured T1 maps were almost identical with different RF durations, which further demonstrated the robustness of the example method.

Figure 10:
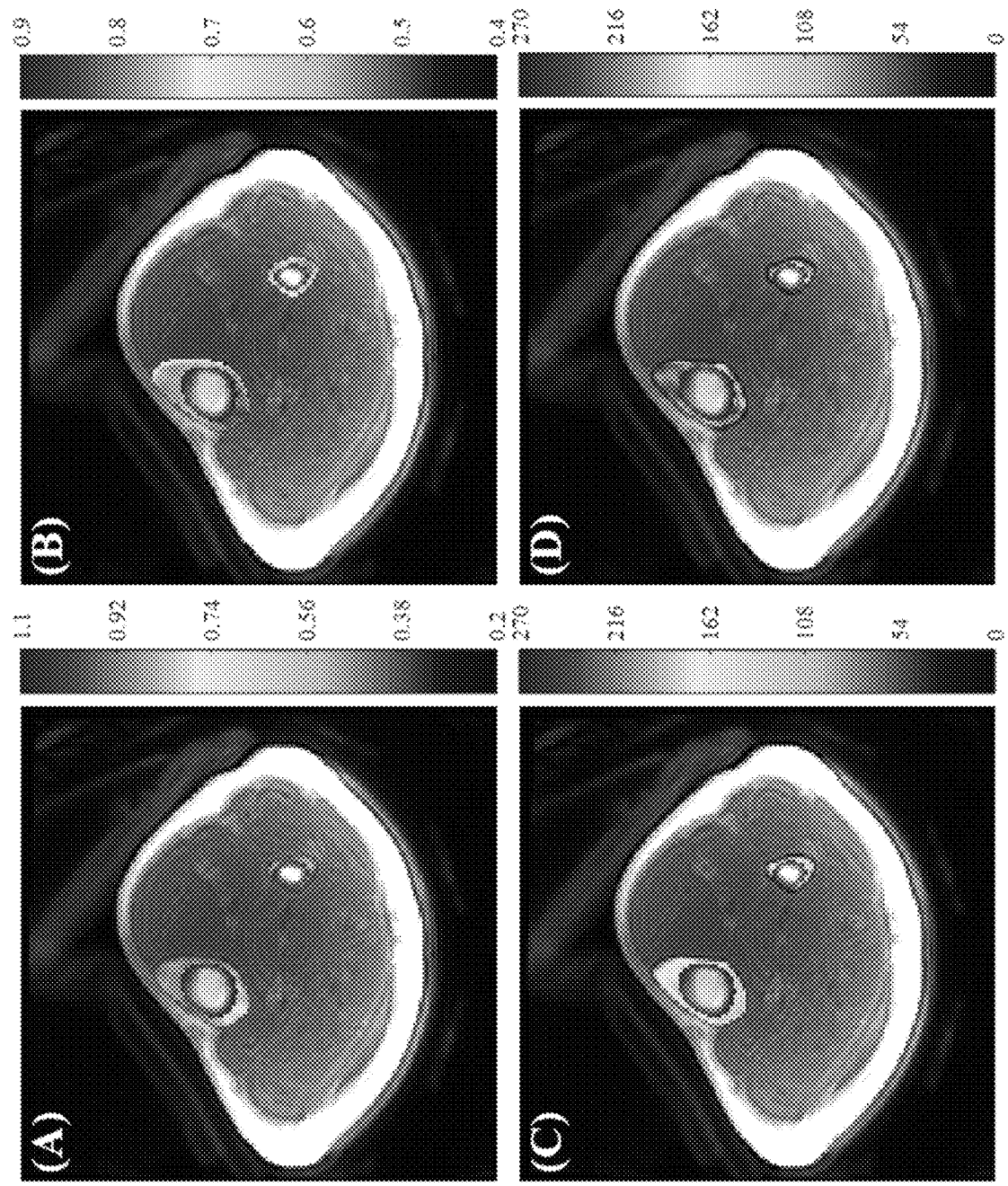
FIG. 10 shows data plots of example in vivo tibial cortical bone results.

FIG. 10 shows data plots of example in vivo tibial cortical bone results. B1 maps (image A) and $f_z$ maps (image B) are calculated from 3D UTE-Cones dual-TR images. T1 maps generated by uncorrected VTR and the example UTE-Cones AFI-VTR methods are shown in images C and D, respectively.

The data plots of FIG. 10 show in vivo tibial cortical bone results from a healthy volunteer. VTR T1 map without correction shows lower T1 values than the T1 map generated by the example UTE-Cones AFI-VTR method, which is consistent with the simulation and phantom results.

Table 1 summarizes T1 measurements for six bovine cortical bone samples and tibial midshaft of three healthy volunteers. The mean and standard deviation of $T_1$ values obtained from the example 3D UTE-Cones AFI-VTR method for the six bovine cortical bone samples and three in vivo tibial cortical bone were 240.0±24.6 and 217.7±10.3 ms, respectively.

Table 1 shows example T1 measurements and its fitting standard error (ms) obtained by an example embodiment of the 3D UTE-Cones AFI-VTR method for six bovine cortical bone samples and in vivo tibial cortical bone of three healthy volunteers.

TABLE 1

| Bovine cortical bone sample | #1 | #2 | #3 | #4 | #5 | #6 |
|---|---|---|---|---|---|---|
| | 257 ± 7 ms | 251 ± 6 ms | 211 ± 5 ms | 206 ± 8 ms | 256 ± 6 ms | 259 ± 7 ms |

| In vivo tibial cortical bone | #1 | #2 | #3 |
|---|---|---|---|
| | 229 ± 12 ms | 215 ± 11 ms | 209 ± 9 ms |

Example applications of the 3D UTE-AFI-VTR methods and systems in accordance with the present technology includes, but is not limited to, the following.

Osteoporosis: T1 is related to cortical porosity. Bone water includes two major parts: pore water which resides in the macroscopic pores and bound water which bounds to collagen matrix. Pore water has longer T1 than bound water. More porous bone has more pore water and likely longer T1. So accurate measurement of bone T1 may provide a biomarker of cortical porosity. Furthermore, accurate measurement of bound and pore water T1s will help accurate quantification of bound and pore water contents, thus more accurate evaluation of bone quality and quantity. These biomarkers are likely to increase the accuracy in predicting bone properties, and improve treatment monitoring.

Osteoarthritis: T1 is closely related to tissue degeneration. Knee OA is a "whole organ disease" involving not only long T2 tissues (such as the superficial layers of articular cartilage), but short T2 tissues such as the deep radial and calcified cartilage, subchondral bone, menisci, ligaments, tendons and cortical bone. Accurate measurement of T1s allow a more systematic evaluation of tissue degeneration in the knee joint, helping early diagnosis of OA and treatment monitoring.

Tendon diseases: Tendon is invisible with conventional clinical MR sequences. T1 of tendon cannot be measured with regular MR techniques. The 3D UTE-AFI-VTR technique allows accurate T1 mapping for tendons, and thus helping early diagnosis of tendon diseases and treatment monitoring.

Neurological diseases involving myelin: recent studies suggest that myelin protons are "invisible" with conventional clinical MR sequences, but can be directly imaged with UTE sequences. The 3D UTE-AFI-VTR method may allow more accurate T1 mapping for myelin protons, and thus helping early diagnosis and treatment monitoring of various neurological diseases such as multiple sclerosis.

Atherosclerosis: Vascular calcification is related to the stability of plaques. Plaque calcification is "invisible" with conventional clinical MR sequences, but "visible" with UTE sequences. The 3D UTE-AFI-VTR method may provide accurate T1 mapping for plaque calcification, may be used as a biomarker of plaque stability.

Breast cancer: Calcification in breast may be related to stages of breast cancer. However, breast calcification is "invisible" with conventional clinical MR sequences, but "visible" with UTE sequences. The 3D UTE-AFI-VTR method may provide accurate T1 mapping for breast calcification, may be used as a biomarker of breast cancer.

Diseases involving iron overload: Iron overload tends to greatly reduce T2* and thus "invisible" with conventional clinical MR sequences, but "visible" with UTE sequences. The 3D UTE-AFI-VTR method may provide accurate T1 mapping for iron overload, may be used as a biomarker of diseases involving iron overload.

Also disclosed are systems and methods for accurately measuring T1 relaxations in MRI by an integrative three-dimensional Ultrashort Echo Time Actual Flip Angle Imaging and Variable Flip Angle method (3D UTE-AFI-VFA). The disclosed methods and systems can be implemented to measure T1 relaxations for major tissues, including in whole knee joints, for a variety of clinical applications.

Example embodiments and implementations of the disclosed 3D UTE-AFI-VFA are described that use a 3D UTE-Cones actual flip angle imaging (AFI) method to map the transmission radio frequency field (B1) in both short and long T2 tissues, which can then be used to correct the 3D UTE-Cones variable flip angle (VFA) fitting to generate accurate T1 maps. In the example implementations described herein, numerical simulation was carried out to investigate the accuracy of T1 measurement for a range of T2 values, excitation pulse durations, and B1 errors. An example embodiment of a 3D UTE-Cones AFI-VFA method was applied to healthy volunteers (n=16) to quantify the T1 of knee tissues including cartilage, meniscus, quadriceps tendon, patellar tendon, anterior cruciate ligament (ACL), posterior cruciate ligament (PCL), marrow and muscles at 3T. Example results of the numerical simulation showed that the 3D UTE-Cones AFI-VFA technique can provide accurate T1 measurements (error less than 1%) when the tissue T2 is longer than 1 ms and a 150 µs excitation RF pulse is used, and thus is suitable for most knee joint tissues. As shown by the implementations of the example 3D UTE-Cones AFI-VFA method on the whole knee joint sample, an average T1 of 1098±67 ms was measured for cartilage, 833±47 ms was measured for meniscus, 800±66 ms was measured for quadriceps tendon, 656±43 ms was measured for patellar tendon, 873±38 ms was measured for ACL, 832±49 ms was measured for PCL, 379±18 ms was measured for marrow, and 1393±46 ms was measured for muscles. The example 3D UTE-Cones AFI-VFA method was thereby shown to provide volumetric T1 measurement of major tissues in whole knee joints on a clinical 3T scanner.

In some implementations, the MR imaging and signal processing system 100 is configured to implement a 3D UTE-AFI-VFA method in accordance with the present technology. For example, the system 100 can implement a magnetic resonance imaging (MRI) method for characterizing a tissue that includes acquiring magnetic resonance data from the tissue in accordance with an ultrashort echo time actual flip angle imaging procedure; and producing T1 maps associated with the tissue by applying a variable flip angle fitting procedure.

Figure 11A:
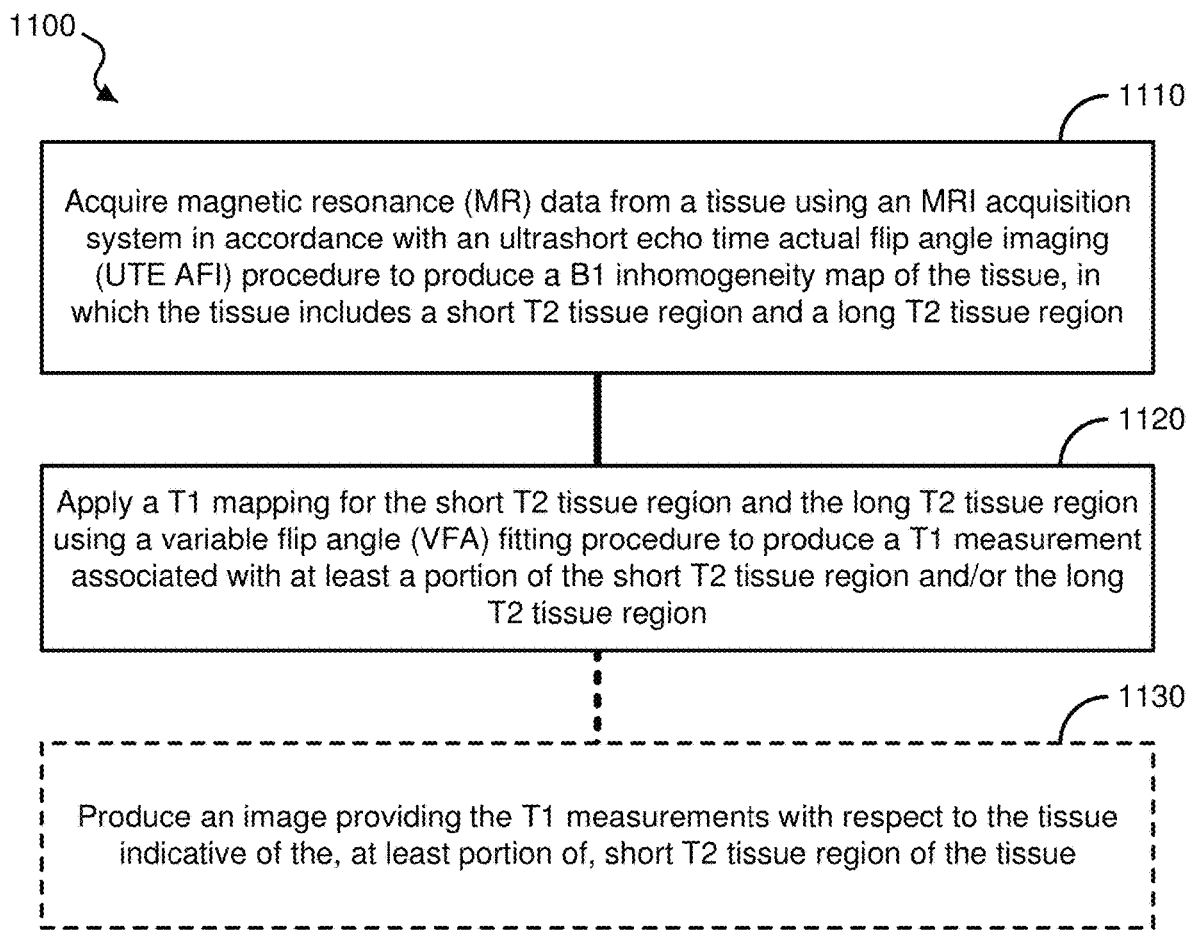
FIGS. 11A and 11B show diagrams of example embodiments of a 3D UTE-AFI-VFA method in accordance with the present technology for characterizing tissue.

FIG. 11A shows a diagram of an example embodiment of a three-dimensional Ultrashort Echo Time Actual Flip Angle Imaging and Variable Flip Angle (3D UTE-AFI-VFA) method 1100 in accordance with the present technology, which can be implemented for characterizing tissue, including short T2 tissues or tissue components, for a variety of tissues within whole joints. Some examples include deep radial and calcified layers of articular cartilage, menisci, ligaments, tendons, iron overload, myelin in white and gray matters, etc. The example 3D UTE-AFI-VFA method 1100 can be implemented using the system 100 shown in FIG. 1.

The method 1100 includes the process 1110 to acquire MR data from the tissue using an MRI acquisition system (e.g., MRI machine 110) in accordance with an ultrashort echo time actual flip angle imaging (UTE AFI) procedure to produce a B1 mapping of the inhomogeneity of RF pulses applied to the tissue, referred to as B1 inhomogeneity map. The tissue can include, but is not limited to, tissue including short T2 tissue region(s) and/or long T2 region(s). For example, the B1 map produced by UTE-AFI procedure is used in the process 1120, discussed below, in an VFA technique to obtain T1 measurements. For example, the VFA-based T1 measurement technique can be used for targeting on the tissue with a T2 longer than 1 ms, whereas the VTR-based T1 measurement technique can be used for characterizing these and other kinds of tissues including tissue with a T2 shorter than 1 ms. B1 map can be accurately determined by UTE-AFI when tissue T2 longer than 1 ms.

The UTE AFI procedure of the process 1110 includes generating a B1 mapping to correct RF field inhomogeneity. In some implementations, for example, the B1 inhomogeneity map is generated by applying an RF pulse sequence at the target tissue for MR data acquisition using an interleaved ultrashort echo time (UTE) acquisition protocol with two different relaxation time parameters (TR1, TR2) and two different areas of gradient crushers in TR1 and TR2. In some example implementations, TR1=20 ms and TR2=100 ms, and the first gradient crusher includes a parameter at 180 mT·ms/m and the second gradient crusher includes a parameter at 900 mT·ms/m; whereas, in some example implementations, TR1 can be in a range of 5 ms to 50 ms, TR2 can be in a range of 25 ms to 400 ms, the first gradient crusher parameter can be in a range of 5 mT·ms/m to 500 mT·ms/m, and the second gradient crusher parameter can be in a range of 250 mT·ms/m to 2500 mT·ms/m. The resultant two sets of data are used to map RF inhomogeneity for short T2 tissue no less than 1 ms and long T2 tissue based on determining the B1 scaling factor ($B_{1s}$), which is obtained by dividing a measured flip angle α by the nominal flip angle $\alpha_{norm}$, ($B_{1s}=\alpha/\alpha_{norm}$). The mapped RF inhomogeneity thereby provides a B1 mapping of the target tissue that can be used to correct the RF field inhomogeneity.

Referring to FIG. 11A, the method 1100 includes a process 1120 to apply a T1 mapping for the short T2 tissue region and the long T2 tissue region using a variable flip angle (VFA) fitting procedure to produce a T1 measurement associated with at least a portion of the short T2 tissue region and/or the long T2 tissue region.

For example, for tissues with T2 values comparable to the RF pulse duration τ, the excitation efficiency of the RF pulse decreases with T2. The high dependency on T2 tissue in the longitudinal magnetization mapping function $f_z(\alpha, \tau, T_2)$ means that Eq. [7], i.e., $$\alpha \approx \arccos\left(\frac{rn-1}{n-r}\right),$$

is no longer accurate for the calculation of α, which can result in inaccurate $B_{1s}$ estimates. This can result in estimation errors for VFA-based T1 measurements because the VFA method is sensitive to B1 errors. Therefore, to arrive at accurate T1 measurements using the VFA method, a signal equation of VFA-based T1 measurement with B1 correction is:

$$S_{spgr} = M_0 \sin(B_{1s}\theta) \frac{1-E_s}{1-E_s\cos(B_{1s}\theta)} \quad [10]$$

where $E_s=\exp(-TR_s/T_1)$, and θ is the nominal flip angle and $TR_s$ is the repetition time of the UTE-Cones sequence. In implementations, for example, the Levenberg-Marquardt algorithm can be used to solve the non-linear fitting of Eq. [10] for VFA-based T1 measurements. This approach can provide robust T1 measurement for both short and long T2 tissues.

Figure 11B:
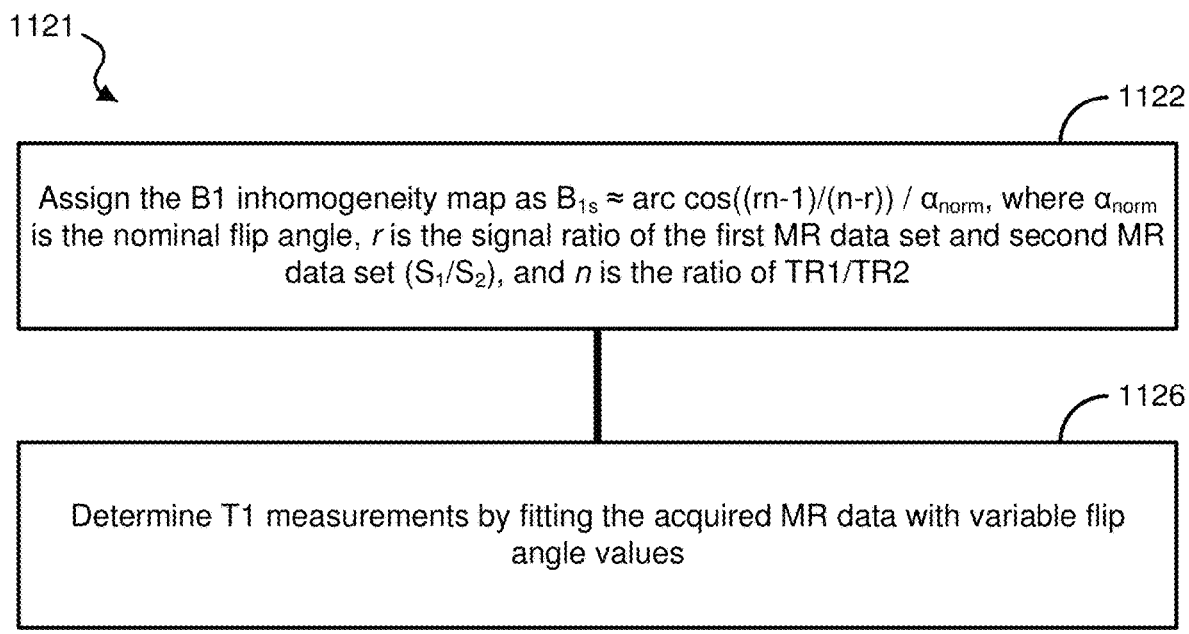

FIG. 11B shows a diagram depicting an example embodiment of a variable flip angle (VFA) fitting procedure 1121 implemented in the process 1120. In implementations of the process 1120, for example, the VFA fitting procedure 1121 includes, at 1122, assigning the B1 inhomogeneity map produced by the UTE-AFI procedure at the process 1110 as $$B_{1s} \approx \arccos\left(\frac{rn-1}{n-r}\right)\bigg/\alpha_{norm},$$

where $\alpha_{norm}$ is the nominal flip angle, r is the signal ratio of the first MR data set and second MR data set ($S_1/S_2$), and n is the ratio of TR1/TR2. The VFA fitting procedure 1121 includes, at 1126, determining T1 by fitting the acquired MR data with variable flip angle values, which results in producing robust T1 measurement values for both short and long T2 tissues. For example, VFA data acquired from the UTE sequence, e.g., with a spoiled gradient-like sequence, can be fit into:

$$S_{spgr} = M_0 \sin(B_{1s}\theta) \frac{1-E_s}{1-E_s\cos(B_{1s}\theta)},$$

where $E=\exp(-TR_s/T_1)$, $\theta$ is the nominal flip angle, $TR_s$ is the repetition time of the UTE sequence. In the process 1126, there are only two unknown parameters in the fitting equation, i.e., $T_1$ and $M_0$, since $B_{1s}$ is obtained from UTE-AFI technique at the process 1110 and assigned with data in the process 1122. In implementations of the process 1126, the Levenberg-Marquardt algorithm can be used for the VTR fitting to estimate T1.

Referring back to FIG. 11A, the method 1100 includes an optional process 1130 to produce an image that provides the T1 measurements with respect to the tissue indicative of the, at least portion of, short T2 tissue region of the tissue. In some implementations of the process 1130, the image can include T1 measurements of other portions of the overall tissue, e.g., including at least a portion of the long T2 tissue, and/or other types of tissue parameters. The method 1100 includes producing an output of the T1 measurements that can include various formats, including as data files, images, or other forms.

Example Implementations

Human knee joints are composed of many soft tissues including articular cartilage, menisci, ligaments, tendons and muscles, all of which are important to the health of the joint. Accurate T1 measurements of the major knee joint tissues can be used for optimization of signal intensity and image contrast. Additionally, T1 relaxation is a fundamental property of a tissue and may be directly useful as a biomarker of disease or degeneration, or used to measure other quantitative MRI biomarkers, such as the macromolecular proton fraction from magnetization transfer modeling or low frequency exchange information from $T_{1\rho}$ imaging.

Some conventional techniques for obtaining T1 measurements include inversion recovery (IR) and saturation recovery (SR) methods). However, conventional MRI pulse sequences (such as SPGR and fast spin echo sequences) are of limited value for imaging deep radial and calcified cartilage, menisci, ligaments, bone and tendons because these tissues typically have T2 values ranging from sub-milliseconds to several milliseconds and thus provide little or no detectable signal. In contrast, all of the major knee joint components, including both short and long T2 tissues, can be imaged using ultrashort echo time (UTE) sequences with TEs less than 100 µs.

However, the IR based UTE (IR-UTE) method is inaccurate for T1 measurement of short T2 tissues because the required inversion pulse is too long (typically on the order of several milliseconds) on currently available clinical scanners to provide complete inversion of the short T2 magnetization. The SR based UTE (SR-UTE) method provides more accurate T1 measurements for short T2 tissues, as compared to IR-UTE, but would require long scan times for volumetric T1 mapping. Notably, UTE-based variable flip angle (VFA) or variable repetition time (VTR) methods can provide volumetric T1 mapping, but they can suffer from high sensitivity to B1 inhomogeneity. Obtaining an accurate B1 map is crucial with VFA and VTR T1 measurement approaches.

Actual flip angle imaging (AFI) is a fast 3D B1 mapping technique which has been successfully used for correction of VFA and VTR based T1 measurements. As discussed above in this disclosure, UTE-AFI can map flip angles for both short T2 tissue and long T2 tissue. However, with conventional peak power limitations on the RF amplifiers of commercially available clinical scanners, the RF pulse duration typically must be increased in order to produce the large flip angle excitation)(>40° required for AFI. This longer RF pulse has reduced excitation efficiency (e.g., T2 relaxation during the RF pulse) for short T2 tissues, which can result in noticeable errors in the derived B1 map when the tissue T2 value is less than 0.5 ms, for example. T2 relaxation during the RF pulse can result in smaller actual flip angles for short/ultrashort T2 components than the nominal flip angle.

In the example implementations, numerical simulations were carried out to investigate the T1 measurement accuracy of an example embodiment of the UTE AFI-VFA method for the knee joint tissues with a variety of T2 values on a clinical scanner. The example 3D UTE-Cones AFI-VFA method was used for in vivo whole knee imaging to measure T1 values of cartilage, meniscus, quadriceps tendon, patellar tendon, anterior cruciate ligament (ACL), posterior cruciate ligament (PCL), marrow and muscles at 3T.

The UTE-AFI procedure in the example 3D UTE-Cones AFI-VFA method is discussed above, e.g., with respect to Equations [1]-[8].

The signal equation of VFA based T1 measurement with $B_1$ correction is expressed as follows:

$$S_{spgr} = M_0 \sin(B_{1s}\theta) \frac{1-E_s}{1-E_s\cos(B_{1s}\theta)} \quad [10]$$

with $E_s=\exp(-TR_s/T_1)$, and where $\theta$ is the nominal flip angle and $TR_s$ is the repetition time of the UTE-Cones sequence.

For example, for tissues with T2 values comparable to the RF duration $\tau$, the excitation efficiency of the RF pulse decreases with T2. The high dependency on tissue T2 in $f_z(\alpha, \tau, T_2)$ means that Eq. [7] is no longer accurate for the calculation of $\alpha$, resulting in inaccurate $B_{1s}$ estimates. This can result in estimation errors for VFA-based T1 measurements because the method is sensitive to $B_1$ errors.

To investigate the accuracy of VFA T1 measurement with AFI B1 correction (UTE AFI-VFA) for tissues with a variety of T2 values on a clinical scanner, numerical simulations were carried out as described below.

Example Methods

In the example implementations, the 3D UTE-Cones and 3D UTE-Cones AFI sequences were implemented on a 3T MR750 scanner (GE Healthcare Technologies, Milwaukee, Wis.). An 8-channel transmit/receive knee coil was used for both RF transmission and signal reception. Unique k-space trajectories were used in the UTE-Cones sequences that sampled data along evenly spaced twisted paths in the form of multiple cones. Data sampling began from the center of k-space and continued outwards. It began as soon as practical after the RF excitation with a minimal nominal delay time of 32 µs. Both RF and gradient spoiling were used to crush the remaining transverse magnetizations. In VFA UTE-Cones, the area of the gradient crushers was 180 mT·ms/m and the RF phase increment was 169°. In UTE-Cones AFI, the areas of gradient crushers in TR1 and TR2 were 180 and 900 mT·ms/m respectively, and the RF phase increment was 39°. The UTE-Cones sequence allowed anisotropic resolution (e.g., higher in-plane resolution and thicker slices) to provide an improved signal to noise ratio (SNR) and a reduced scan time relative to isotropic imaging.

Example Simulation

Numerical simulation was performed to investigate the accuracy of the example UTE AFI-VFA T1 measurement for relatively short T2 tissues. The example UTE AFI-VFA technique was expected to accurately measure T1 for long T2 tissues. Simulated rectangular RF pulses used for signal excitation in both the 3D UTE AFI and VFA sequences had identical durations and ranged from 0.1 to 300 µs. T2 values of simulated tissues ranged from 0 to 5 ms. The B1 scaling factors and the ratio between $f_{xy}$ and $\sin(B_{1s}\theta)$ measured with different nominal flip angles (range from 0° to 90°) for short T2s were also investigated with a pulse duration of 150 µs. This ratio was calculated to investigate whether the obtained $B_{1s}$ could correct the transverse part of the excitation. The T1 measurement accuracy with the VFA method depends on the accurate correction of both transverse and longitudinal magnetizations after excitation. The T1 value was set to a constant of 800 ms and $M_0$ was set to 1. The sequence parameters for UTE AFI and VFA sequences were adjusted as follows, for example: 1) UTE-AFI: TR1/TR2=20/100 ms and flip angle=45°; 2) UTE-VFA: TR=20 ms, and flip angle=5°, 10°, 20° and 30°. B1 scaling factors and T1 values with and without B1 correction were calculated for three nominal B1 scaling factors ($B_{1n}$): 0.8, 1 and 1.2.

Example In Vivo Study

In vivo whole knee imaging was carried out on 16 healthy volunteers (aged 20-49 years, mean age 34 years; 7 males, 9 females). Informed consent was obtained from all subjects in accordance with guidelines of the institutional review board. The 3D UTE-Cones AFI and VFA sequences were used to scan these knee joints using the same field of view (FOV) of 15×15×10.8 $cm^3$ and receiver bandwidth of 166 kHz. Other sequence parameters were: 1) 3D UTE-Cones AFI: TR1/TR2=20/100 ms, flip angle=45°, acquisition matrices of 128×128×18, readout duration=924 µs and a total scan time of 4 min 57 sec; 2) 3D VFA UTE-Cones: TR=20 ms, flip angle=5°, 10°, 20° and 30°, acquisition matrices of 256×256×36, under-sampling factor of 0.9, readout duration=1644 µs and a total scan time of 9 min 28 sec.

Example Data Analysis

Before T1 calculation, motion registration was performed for all datasets using the Elastix open source software. Rigid registration was carried out first to correct for tissue translations and rotations, and then non-rigid registration was applied for further fine adjustment (such as scaling and shearing), which is particularly important for soft tissues. The Levenberg-Marquardt algorithm was used to solve the non-linear fitting of Eq. [10] for VFA T1 measurement. The analysis algorithms written in Matlab were applied to the DICOM images obtained from the 3D UTE-Cones AFI and VFA UTE-Cones protocols described above. Both T1 values and fitting errors were calculated. Manually drawn regions-of-interest for the 16 in vivo knees were used to measure the mean and standard deviation T1 values of various tissues including the articular cartilage, meniscus, quadriceps tendon, patellar tendon, ACL, PCL, marrow and muscles.

Example Results

Figure 12:
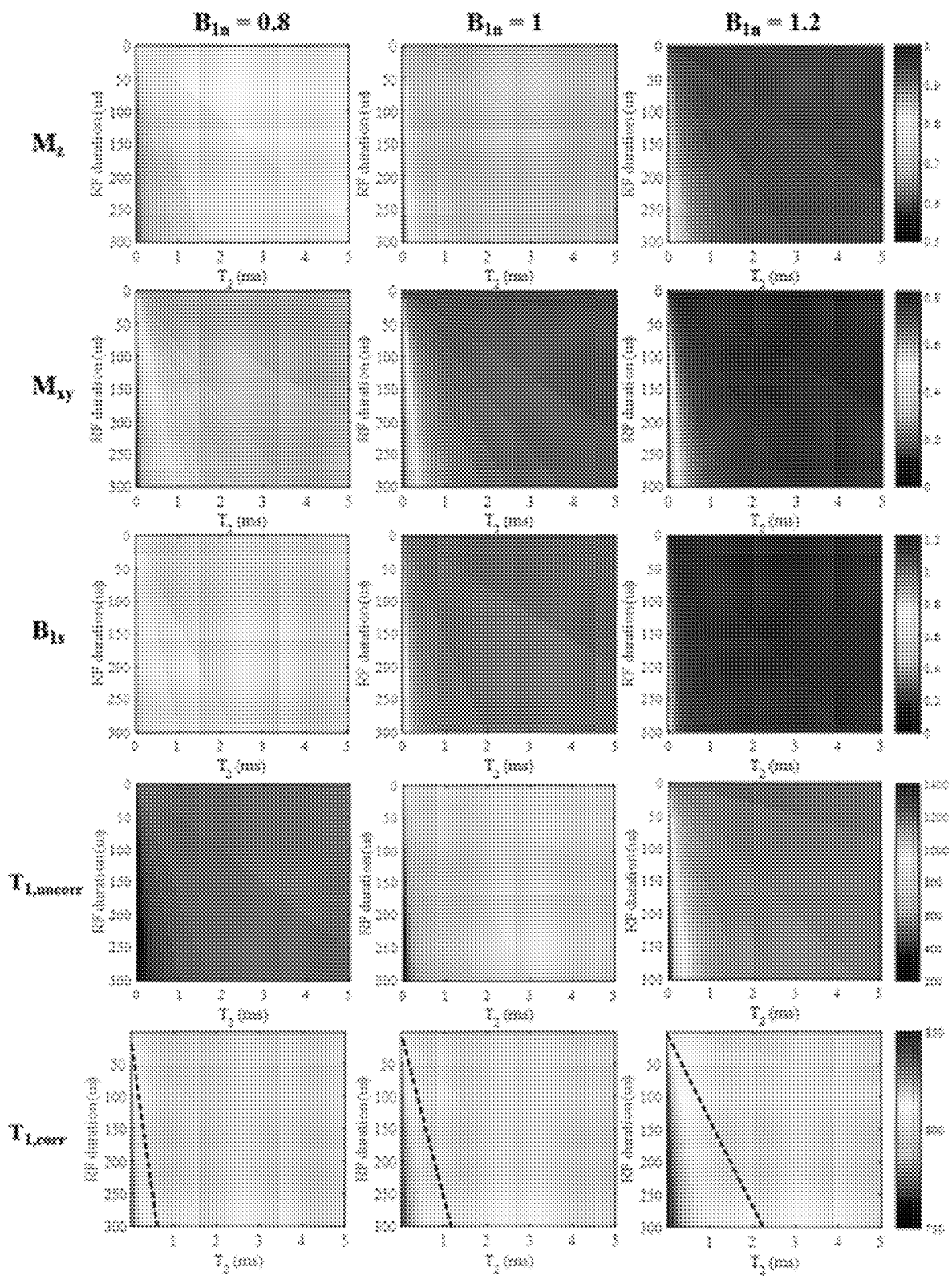
FIG. 12 shows image plots of example simulation results for different T2 tissues with rectangular RF pulse excitation.

FIG. 12 shows example simulation results for different T2 tissues (T2 values from 0 to 5 ms) with rectangular RF pulse excitation (durations from 0.1 to 300 µs). The top two rows show color maps corresponding to the longitudinal ($M_z$ or $f_z(\alpha, \tau, T_2)$) and transverse ($M_{xy}$ or $f_{xy}(\alpha, \tau, T_2)$) magnetizations calculated from Eqs. [3] and [4]. Longer RF pulses were shown to be less effective than shorter ones in generating $M_{xy}$ for shorter T2 tissues. $M_z$ and $M_{xy}$ approached $\cos(\alpha)$ and $\sin(\alpha)$, respectively, as T2 increased. The third row shows the resulting $B_{1s}$ scaling factors obtained by the AFI method (i.e. Eqs. [7] and [8]). For example, the measured $B_{1s}$ were more accurate when using shorter RF pulses and when imaging longer T2 species. Otherwise, the estimated $B_{1s}$ were smaller than the nominal values. T1 values (units of ms) generated by the VFA method are shown without (fourth row) and with $B_{1s}$ correction (fifth row). For the B1-corrected T1 results, a dashed black line was drawn such that the region to the left of the line had a T1 estimation error greater than 1% and the region to the right had an estimation error less than 1%. The columns represent simulation results with nominal B1 scaling factors $B_{1n}$ of 0.8, 1, and 1.2, respectively.

The bottom two rows show the simulation results of T1 measurements using the VFA method without and with B1 correction. The $B_1$-uncorrected T1 values show significant estimation errors and increased with larger values of the nominal $B_1$ scaling factor $B_{1n}$. Overall, the T1 values generated by the B1-corrected VFA method were much more accurate than the T1 values measured by the B1-uncorrected VFA method. However, T1 estimation errors still existed in the B1-corrected T1 values when T2 values were shorter than 0.5 ms, and the errors became larger with increased $B_{1n}$. All three of the $B_1$-corrected T1 maps were separated into two regions by dashed black lines: the T1 estimation errors were higher than 1% in the bottom left portions (triangular shaped area) and the T1 estimation errors in the other portions were lower than 1%. Thus, it was found that when an excitation pulse with a duration of 150 µs is used for imaging tissues with T2 values greater than 1 ms, the B1-corrected T1 value measured by the AFI-VFA method is accurate with less than 1% estimation error in the setting of up to 20% B1 inhomogeneity.

Figure 13:
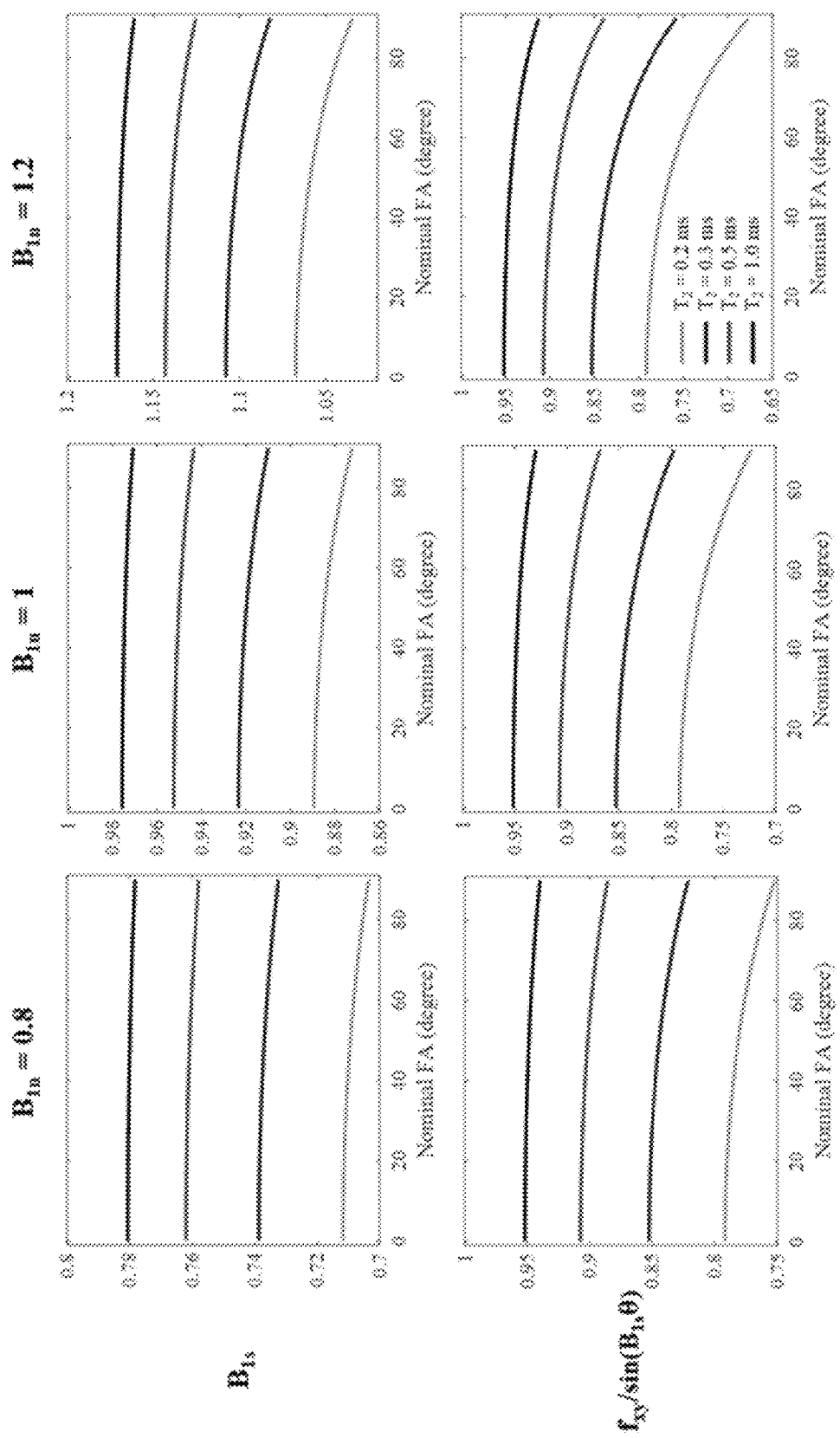
FIG. 13 shows image plots of example simulation curves with a range of nominal flip angles for different T2 tissues with rectangular RF pulse excitation.

FIG. 13 shows example simulation curves with a range of nominal flip angles for different T2 tissues (green: 0.2 ms, blue: 0.3 ms, red: 0.5 ms and black: 1 ms) with rectangular RF pulse excitation (nominal FA from 0° to 90°; pulse duration τ=150 µs). The first row shows the resulting B1 scaling factors obtained by the AFI method (i.e., Eqs. [7] and [8]). The second row shows the ratio between $f_{xy}$ in Eq. [3] and $\sin(B_{1s}\theta)$ in Eq. [9]. The columns represent simulation results with nominal B1 scaling factors $B_{1n}$ of 0.8, 1, and 1.2, respectively.

Both B1 scaling factors and the ratio between $f_{xy}$ and $\sin(B_{1s}\theta)$ slightly changed with different nominal flip angles. More changes can be found when tissue T2 is shorter. So for shorter T2s, a single correction factor is not good enough to correct the excitation errors in different flip angles for VFA T1 measurement as shown in the last row of FIG. 12. However, both $B_{1s}$ and the ratio almost stay constant for flip angles lower than 50° when T2 is 1 ms or longer, which demonstrate the accuracy of the example AFI-VFA T1 measurement method for tissues with $T2_s$ longer than 1 ms.

Since the articular cartilage, meniscus, quadriceps tendon, patellar tendon, ACL, PCL, marrow and muscles all have T2 values longer than 1 ms, the B1-corrected VFA method with a 150 µs long excitation pulse should be suitable for the measurement of T1 values of these tissues. The signal intensities of the tissues have been measured before and after registration. There were almost no signal intensity changes due to the motion registration.

Figure 14:
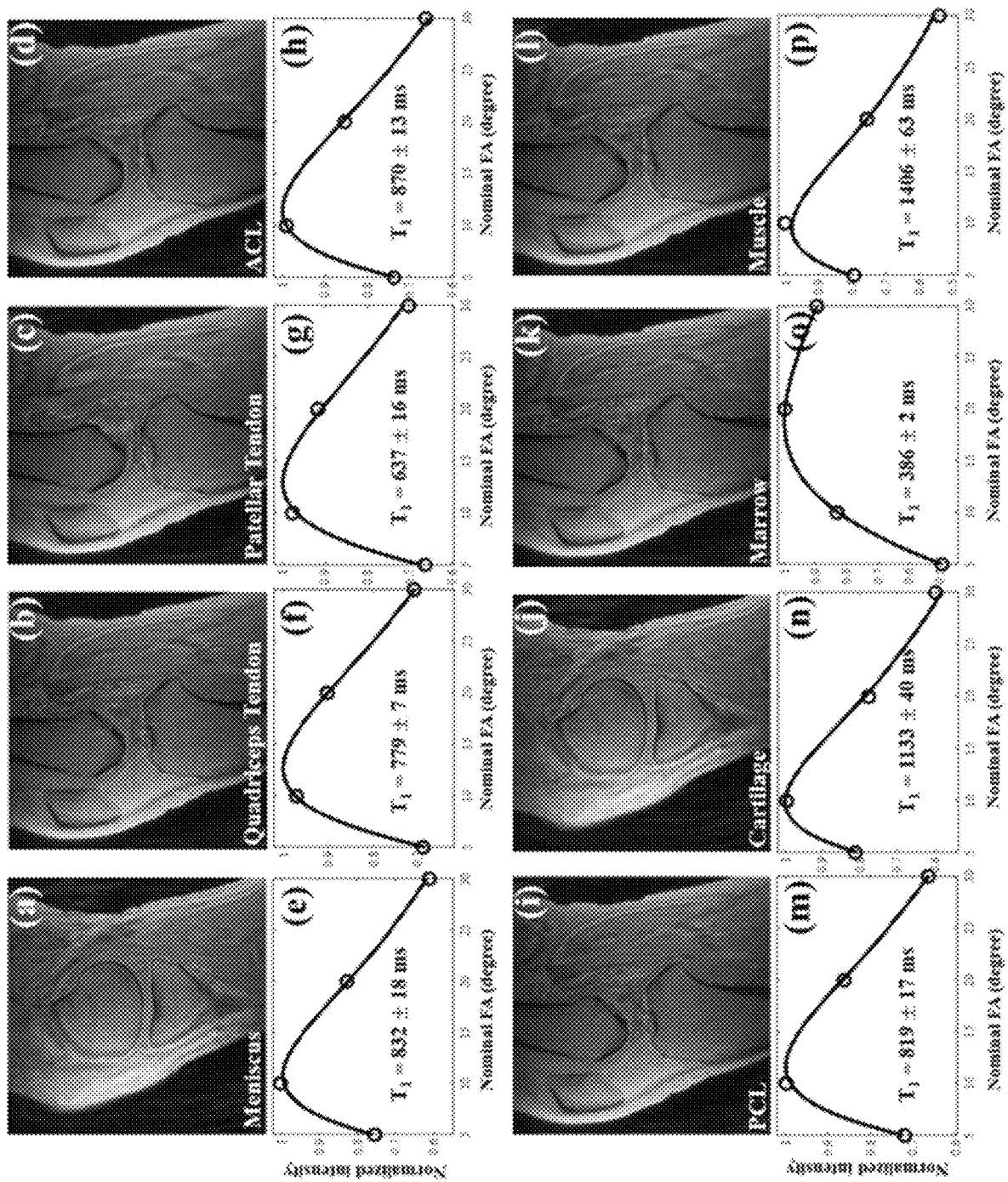
FIG. 14 shows image and data plots of example T1 fitting results in knee tissues from a human subject using an example 3D UTE-Cones AFI-VFA method.

FIG. 14 shows example T1 fitting results in knee tissues from a subject using the example 3D UTE-Cones AFI-VFA method. The example T1 fitting results shown in FIG. 4 depict various knee joint tissues of a representative healthy volunteer (age 35, male). All the data showed excellent fittings. The example 3D UTE-Cones AFI-VFA method showed a T1 value of 832±18 ms for meniscus, 779±7 ms for quadriceps tendon, 637±16 ms for patellar tendon, 870±13 ms for ACL, 819±17 ms for PCL, 1133±40 ms for cartilage, 386±2 ms for marrow and 1406±63 ms for muscles of this volunteer.

Figure 15:
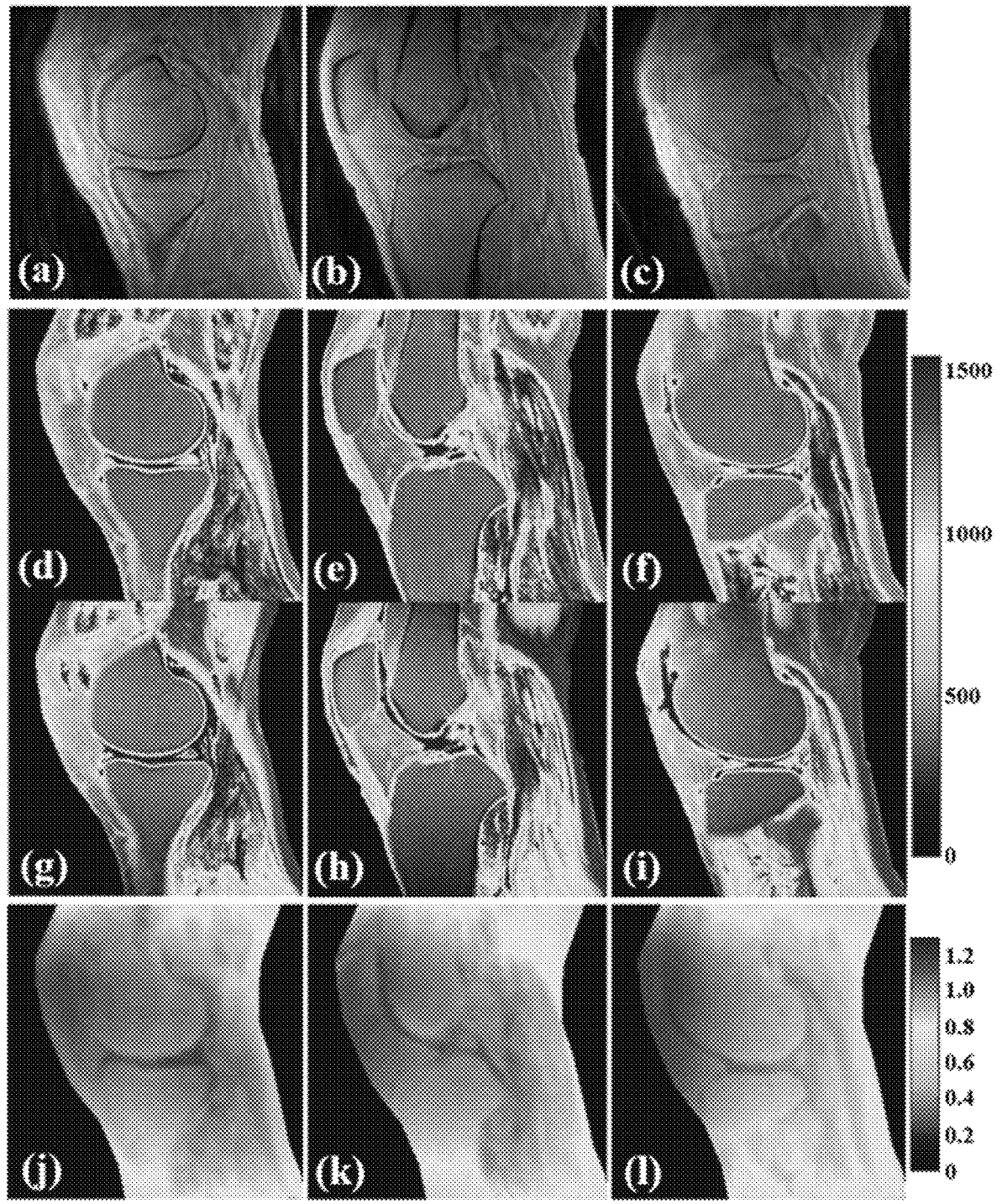
FIG. 15 shows image plots of example T1 mapping results of the knee of the subject.

FIG. 15 shows example T1 mapping results of the knee of the same healthy volunteer as above. Images (a)-(c) are the selected VFA images with FA=5°. T1 mapping using both the example 3D UTE-Cones AFI-VFA are shown in images (d)-(f), and B1-uncorrected VFA are shown in images (g)-(i). The $B_{1s}$ maps generated by the AFI technique (j)-(l) are shown. B1 inhomogeneity induced T1 estimation errors in the images (g)-(i) have been corrected by the example 3D UTE-Cones AFI-VFA method, especially in regions close to the coil boundary.

T1 maps generated by the example 3D UTE-Cones AFI-VFA method are shown in image (d) to image (f). For comparison, the T1 maps generated by the 3D UTE-Cones VFA method without B1 correction are shown in image (g) to image (i) of FIG. 15. T1 estimation errors induced by B1 inhomogeneity, which are more severe in regions close to the coil boundary, have been corrected by the example 3D UTE-Cones AFI-VFA method. Corresponding $B_{1s}$ maps are shown in image (j) to (l). As expected, lower $B_{1s}$ values can be found in cortical bone regions due to lower excitation efficiency.

Table 2 summarizes T1 measurements by the example 3D UTE-Cones AFI-VFA method for the principal knee joint tissues of healthy volunteers (n=16). The example 3D UTE-Cones AFI-VFA method showed a mean T1 value and standard deviation of 833±47 ms for meniscus, 800±66 ms for quadriceps tendon, 656±43 ms for patellar tendon, 873±38 ms for ACL, 832±49 ms for PCL, 1098±67 ms for cartilage, 379±18 ms for marrow and 1393±46 ms for muscles.

Table 2 shows the mean and standard deviations of example T1 values of knee tissues of 16 healthy volunteers measured by the proposed 3D UTE-Cones AFI-VFA method.

TABLE 2

| Meniscus | Quadriceps tendon | Patellar tendon | ACL |
|---|---|---|---|
| 833 ± 47 ms | 800 ± 66 ms | 656 ± 43 ms | 873 ± 38 ms |
| PCL | Cartilage | Marrow | Muscle |
| 832 ± 49 ms | 1098 ± 67 ms | 379 ± 18 ms | 1393 ± 46 ms |

The example results demonstrate that the example 3D UTE-Cones AFI-VFA method can accurately measure T1 values for most major tissues of the whole knee joint. For example, the simulation shows that the example 3D UTE-Cones AFI-VFA method provides accurate T1 measurements for tissues with T2 values longer than 1 ms. Since most knee tissues have T2s longer than 1 ms (e.g., meniscus: 5-8 ms, ligament and tendon: 4-10 ms, cartilage: 27-43 ms, muscle: 32-50 ms and fat: ~133 ms), accurate T1 maps were obtained using the example method to provide in vivo knee measurements in 16 healthy volunteers.

Due to the high sensitivity in VFA T1 measurements to B1 errors, obtaining an accurate B1 map is crucial. AFI is a fast 3D B1 mapping technique which fits very well with VFA based T1 corrections. 3D UTE-Cones employs a spiral trajectory data acquisition with conical view ordering, which provide the flexibility to stretch each spiral interleave to vastly reduce the total number of interleaves.

For example, as shown in the simulation study and a cortical bone study, the VFA T1 maps did not show much improvement after B1 correction for very short T2 tissues such as cortical bone. However, for tissues with T2 values longer than 1 ms (much longer than pulse duration of 150 µs), the obtained $B_{1s}$ is almost accurate and AFI-VFA can provide accurate T1 measurement. The coverage of the simulated nominal $B_1$ scaling factors $B_{1n}$ from 0.8 to 1.2 should be wide enough for most cases of in vivo knee imaging. Thus, in the example implementations, the example 3D UTE-Cones AFI-VFA method was able to accurately measure T1 of all the major knee tissues except for bone.

The example results descried above may be the first report of T1 values for all the soft tissues in the human knee joint in vivo. Notably, most of previous T1 measurement studies focused on the articular cartilage, meniscus and muscle. The T1 values of the ligaments including quadriceps tendon, patellar tendon, ACL and PCL have been barely studied since they are not detected by clinical sequences due to their relatively short T2 values. The example T1 values measured for cartilage (e.g., ~1098 ms), muscle (e.g., ~1393 ms) and marrow (e.g., ~379 ms) at 3T are comparable with previous 3T studies.

The example 3D UTE-Cones AFI-VFA method was shown to provide a robust technique for volumetric T1 mapping of all the soft tissues in knee joints in vivo with a clinical 3T scanner, including the articular cartilage, meniscus, quadriceps tendon, patellar tendon, ACL, PCL, marrow and muscles.

EXAMPLES

In some example embodiments in accordance with the present technology (example 1), a magnetic resonance imaging (MRI) method for characterizing a tissue includes (a) acquiring magnetic resonance (MR) data from a tissue using an MRI system in accordance with an ultrashort echo time actual flip angle imaging (UTE AFI) procedure to produce a longitudinal magnetization mapping function of radio frequency (RF) pulses applied to the tissue, in which the tissue includes a short T2 tissue region and a long T2 tissue region, wherein the acquiring the MR data includes: (i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and (ii) generating the longitudinal magnetization mapping function of the applied RF pulses from the first MR data set corresponding to short T2 tissue and from the second MR data set corresponding to long T2 tissue within the target tissue; (b) applying a T1 mapping for the short T2 tissue region and the long T2 tissue region using a variable repetition time (VTR) fitting procedure to produce a T1 measurement associated with at least a portion of the short T2 tissue region; and (c) producing an image providing the T1 measurements with respect to the tissue indicative of the, at least portion of, short T2 tissue region of the tissue.

Example 2 includes the method of example 1, in which the first TR parameter is in a range of 5 ms to 50 ms, and the second TR parameter in a range of 25 ms to 400 ms; and in which a parameter of the first gradient crusher is in a range of 5 mT·ms/m to 500 mT·ms/m, and a parameter of the second gradient crusher is in a range of 250 mT·ms/m to 2500 mT·ms/m.

Example 3 includes the method of example 1, in which the first TR parameter is 20 ms, and the second TR parameter is 100 ms; and in which the first gradient crusher includes a parameter at 180 mT·ms/m and the second gradient crusher includes a parameter at 900 mT·ms/m.

Example 4 includes the method of example 1, in which the applying the T1 mapping includes assigning the longitudinal magnetization mapping function based on a signal ratio (r) of the first and second MR data sets and a TR ratio (n) of the first and second TR parameters in accordance with (r n−1)/(n−r), where r is the signal ratio of the first MR data set and second MR data set (S1/S2), and n is the TR ratio of the first TR parameter and the second TR parameter (TR1/TR2); combining the magnetization in thermal equivalent coefficient ($M_0$) and the transversal mapping function ($f_{xy,s}$ ($\alpha$, $\tau$, T2)) into a single unknown parameter (g); and determining the T1 measurement by fitting the acquired MR data with variable TR values.

Example 5 includes the method of example 4, in which the fitting the acquired MR data with variable TR values includes calculating T1 values using $$S_{spgr} = M_0 f_{xy,s}(\alpha, \tau, T_2) \frac{1-E}{1 - E f_{z,s}(\alpha, \tau, T_2)},$$

where $E=\exp(-TR_s/T_1)$, and where $TR_s$ is the repetition time of the UTE sequence.

Example 6 includes the method of example 1, in which the tissue includes menisci, ligaments, tendons, myelin in gray and white matter, or cortical bone.

In some example embodiments in accordance with the present technology (example 7), a magnetic resonance imaging (MRI) system for characterizing a tissue includes an MRI acquisition system including a magnet to generate a principal magnetic field ($B_0$), a radio frequency (RF) subsystem to apply a plurality of RF pulses to a tissue and to detect an echo signal, and a gradient subsystem to apply a plurality of gradient fields to the tissue, in which the tissue includes a short T2 tissue region and a long T2 tissue region; and a data processing device in communication with the MRI acquisition system and including a processor and memory, the data processing device configured to: (a) cause the MRI acquisition system to acquire magnetic resonance (MR) data of the tissue in accordance with an ultrashort echo time actual flip angle (UTE-AFI) procedure, (b) process the acquired MR data to produce a longitudinal magnetization mapping function of the plurality of RF pulses applied to the tissue; and (b) apply a T1 mapping for the short T2 tissue region and the long T2 tissue region using a variable repetition time (VTR) fitting procedure to produce a T1 measurement associated with at least a portion of the short T2 tissue region, in which the data processing device acquires the MR data by applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher, and in which the data processing device processes the acquired MR data by generating the longitudinal magnetization mapping function of the applied RF pulses from the first MR data set corresponding to short T2 tissue and from the second MR data set corresponding to long T2 tissue within the target tissue.

Example 8 includes the system of example 7, in which the first TR parameter is in a range of 5 ms to 50 ms, and the second TR parameter in a range of 25 ms to 400 ms; and in which a parameter of the first gradient crusher is in a range of 5 mT·ms/m to 500 mT·ms/m, and a parameter of the second gradient crusher is in a range of 250 mT·ms/m to 2500 mT·ms/m.

Example 9 includes the system of example 7, in which the first TR parameter is 20 ms, and the second TR parameter is 100 ms; and in which the first gradient crusher includes a parameter at 180 mT·ms/m and the second gradient crusher includes a parameter at 900 mT·ms/m.

Example 10 includes the system of example 7, in which the data processing device applies the T1 mapping by assigning the longitudinal magnetization mapping function based on a signal ratio (r) of the first and second MR data sets and a TR ratio (n) of the first and second TR parameters in accordance with (r n−1)/(n−r), where r is the signal ratio of the first MR data set and second MR data set (S1/S2), and n is the TR ratio of the first TR parameter and the second TR parameter (TR1/TR2); combining the magnetization in thermal equivalent coefficient ($M_0$) and the transversal mapping function ($f_{xy,s}$($\alpha$, $\tau$, T2)) into a single unknown parameter (g); and determining the T1 measurement by fitting the acquired MR data with variable TR values.

Example 11 includes the system of example 10, in which the fitting the acquired MR data with variable TR values includes calculating T1 values using $$S_{spgr} = M_0 f_{xy,s}(\alpha, \tau, T_2) \frac{1-E}{1 - E f_{z,s}(\alpha, \tau, T_2)},$$

where $E=\exp(-TR_s/T_1)$, and where $TR_s$ is the repetition time of the UTE sequence.

Example 12 includes the system of example 7, in which the tissue includes menisci, ligaments, tendons, myelin in gray and white matter, or cortical bone.

In some example embodiments in accordance with the present technology (example 13), a magnetic resonance imaging (MRI) method for characterizing a tissue includes (a) acquiring magnetic resonance (MR) data from a tissue using an MRI system in accordance with an ultrashort echo time actual flip angle imaging (UTE AFI) procedure to produce a B1 inhomogeneity map of the tissue, in which the tissue includes a short T2 tissue region and a long T2 tissue region, wherein the acquiring the MR data includes: (i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and (ii) generating the B1 inhomogeneity map from the first MR data set corresponding to short T2 tissue and from the second MR data set corresponding to long T2 tissue within the target tissue; (b) applying a T1 mapping for the short T2 tissue region and the long T2 tissue region using a variable flip angle (VFA) fitting procedure to produce a T1 measurement associated with at least a portion of the short T2 tissue region; and (c) producing an image providing the T1 measurements with respect to the tissue indicative of the, at least portion of, short T2 tissue region of the tissue.

Example 14 includes the method of example 13, in which the first TR parameter is in a range of 5 ms to 50 ms, and the second TR parameter in a range of 25 ms to 400 ms; and in which a parameter of the first gradient crusher is in a range of 5 mT·ms/m to 500 mT·ms/m, and a parameter of the second gradient crusher is in a range of 250 mT·ms/m to 2500 mT·ms/m.

Example 15 includes the method of example 13, in which the first TR parameter is 20 ms, and the second TR parameter is 100 ms; and in which the first gradient crusher includes a parameter at 180 mT·ms/m and the second gradient crusher includes a parameter at 900 mT·ms/m.

Example 16 includes the method of example 13, in which the applying the T1 mapping includes assigning the B1 inhomogeneity map based on a nominal flip angle, a signal ratio (r) of the first and second MR data sets, and a TR ratio (n) of the first and second TR parameters in accordance with arc cosine of ((r n−1)/(n−r)) divided by the nominal flip angle, where r is the signal ratio of the first MR data set and second MR data set (S1/S2), and n is the TR ratio of the first TR parameter and the second TR parameter (TR1/TR2); and determining the T1 measurement by fitting the acquired MR data with variable flip angle values.

Example 17 includes the method of example 16, in which the fitting the acquired MR data with variable TR values includes calculating T1 values using $$S_{spgr} = M_0 \sin(B_{1s}\theta) \frac{1-E_s}{1-E_s\cos(B_{1s}\theta)},$$

where $E=\exp(-TR_s/T_1)$, and where $TR_s$ is the repetition time of the UTE sequence.

Example 18 includes the method of example 13, in which the tissue includes soft tissue in a whole joint.

Example 19 includes the method of example 18, wherein the whole joint includes a knee joint, and the soft tissue includes one or more of cartilage, meniscus, quadriceps tendon, patellar tendon, anterior cruciate ligament, posterior cruciate ligament, marrow or muscle.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A magnetic resonance imaging (MRI) method for characterizing a tissue, comprising:
    (a) acquiring magnetic resonance (MR) data from a tissue using an MRI system in accordance with an ultrashort echo time actual flip angle imaging (UTE AFI) procedure to produce a longitudinal magnetization mapping function of radio frequency (RF) pulses applied to the tissue, wherein the tissue includes a short T2 tissue region and a long T2 tissue region,
    wherein the acquiring the MR data includes:
        (i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and
        (ii) generating the longitudinal magnetization mapping function of the applied RF pulses from the first MR data set corresponding to short T2 tissue and from the second MR data set corresponding to long T2 tissue within the target tissue;
    (b) applying a T1 mapping for the short T2 tissue region and the long T2 tissue region using a variable repetition time (VTR) fitting procedure to produce a T1 measurement associated with at least a portion of the short T2 tissue region; and
    (c) producing an image providing the T1 measurements with respect to the tissue indicative of the, at least portion of, short T2 tissue region of the tissue.

2. The method of claim 1, wherein the first TR parameter is in a range of 5 ms to 50 ms, and the second TR parameter in a range of 25 ms to 400 ms; and wherein a parameter of the first gradient crusher is in a range of 5 mT·ms/m to 500 mT·ms/m, and a parameter of the second gradient crusher is in a range of 250 mT·ms/m to 2500 mT·ms/m.

3. The method of claim 1, wherein the first TR parameter is 20 ms, and the second TR parameter is 100 ms; and wherein the first gradient crusher includes a parameter at 180 mT·ms/m and the second gradient crusher includes a parameter at 900 mT·ms/m.

4. The method of claim 1, wherein the tissue includes menisci, ligaments, tendons, myelin in gray and white matter, or cortical bone.

5. The method of claim 1, wherein the applying the T1 mapping includes:
    assigning the longitudinal magnetization mapping function based on a signal ratio (r) of the first and second MR data sets and a TR ratio (n) of the first and second TR parameters in accordance with (r n−1)/(n−r), where r is the signal ratio of the first MR data set and second MR data set (S1/S2), and n is the TR ratio of the first TR parameter and the second TR parameter (TR1/TR2);
    combining the magnetization in thermal equivalent coefficient ($M_0$) and the transversal mapping function ($f_{xy,s}(\alpha, \tau, T2)$) into a single unknown parameter (g); and
    determining the T1 measurement by fitting the acquired MR data with variable TR values.

6. The method of claim 5, wherein the fitting the acquired MR data with variable TR values includes calculating T1 values using $$S_{spgr} = M_0 f_{xy,s}(\alpha, \tau, T_2) \frac{1-E}{1-E f_{z,s}(\alpha, \tau, T_2)},$$

where $E = \exp(-TR_s/T_1)$, and where $TR_s$ is the repetition time of the UTE sequence.

7. A magnetic resonance imaging (MRI) system for characterizing a tissue, comprising:
    an MRI acquisition system including a magnet to generate a principal magnetic field ($B_0$), a radio frequency (RF) subsystem to apply a plurality of RF pulses to a tissue and to detect an echo signal, and a gradient subsystem to apply a plurality of gradient fields to the tissue, wherein the tissue includes a short T2 tissue region and a long T2 tissue region; and
    a data processing device in communication with the MRI acquisition system and including a processor and memory, the data processing device configured to: (a) cause the MRI acquisition system to acquire magnetic resonance (MR) data of the tissue in accordance with an ultrashort echo time actual flip angle (UTE-AFI) procedure, (b) process the acquired MR data to produce a longitudinal magnetization mapping function of the plurality of RF pulses applied to the tissue; and (b) apply a T1 mapping for the short T2 tissue region and the long T2 tissue region using a variable repetition time (VTR) fitting procedure to produce a T1 measurement associated with at least a portion of the short T2 tissue region,
    wherein the data processing device acquires the MR data by applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher, and wherein the data processing device processes the acquired MR data by generating the longitudinal magnetization mapping function of the applied RF pulses from the first MR data set corresponding to short T2 tissue and from the second MR data set corresponding to long T2 tissue within the target tissue.

8. The system of claim 7, wherein the first TR parameter is in a range of 5 ms to 50 ms, and the second TR parameter in a range of 25 ms to 400 ms; and wherein a parameter of the first gradient crusher is in a range of 5 mT·ms/m to 500 mT·ms/m, and a parameter of the second gradient crusher is in a range of 250 mT·ms/m to 2500 mT·ms/m.

9. The system of claim 7, wherein the first TR parameter is 20 ms, and the second TR parameter is 100 ms; and wherein the first gradient crusher includes a parameter at 180 mT·ms/m and the second gradient crusher includes a parameter at 900 mT·ms/m.

10. The system of claim 7, wherein the tissue includes menisci, ligaments, tendons, myelin in gray and white matter, or cortical bone.

11. The system of claim 7, wherein the data processing device applies the T1 mapping by:
assigning the longitudinal magnetization mapping function based on a signal ratio (r) of the first and second MR data sets and a TR ratio (n) of the first and second TR parameters in accordance with (r n−1)/(n−r), where r is the signal ratio of the first MR data set and second MR data set (S1/S2), and n is the TR ratio of the first TR parameter and the second TR parameter (TR1/TR2);
combining the magnetization in thermal equivalent coefficient ($M_0$) and the transversal mapping function ($f_{xy,s}(\alpha, \tau, T_2)$) into a single unknown parameter (g); and
determining the T1 measurement by fitting the acquired MR data with variable TR values.

12. The system of claim 11, wherein the fitting the acquired MR data with variable TR values includes calculating T1 values using $$S_{spgr} = M_0 f_{xy,s}(\alpha, \tau, T_2) \frac{1-E}{1-Ef_{z,s}(\alpha, \tau, T_2)},$$

where $E=\exp(-TR_s/T_1)$, and where $TR_s$ is the repetition time of the UTE sequence.

13. A magnetic resonance imaging (MRI) method for characterizing a tissue, comprising:
(a) acquiring magnetic resonance (MR) data from a tissue using an MRI system in accordance with an ultrashort echo time actual flip angle imaging (UTE AFI) procedure to produce a B1 inhomogeneity map of the tissue, wherein the tissue includes a short T2 tissue region and a long T2 tissue region,
wherein the acquiring the MR data includes:
(i) applying an RF pulse sequence at the tissue using an interleaved ultrashort echo time (UTE) acquisition protocol that includes two or more differing TR parameters and two or more differing gradient crusher parameters, from which the acquired MR data includes (1) a first MR data set corresponding to a first TR parameter and first gradient crusher and (2) a second MR data set corresponding to a second TR parameter and second gradient crusher; and
(ii) generating the B1 inhomogeneity map from the first MR data set corresponding to short T2 tissue and from the second MR data set corresponding to long T2 tissue within the target tissue;
(b) applying a T1 mapping for the short T2 tissue region and the long T2 tissue region using a variable flip angle (VFA) fitting procedure to produce a T1 measurement associated with at least a portion of the short T2 tissue region; and
(c) producing an image providing the T1 measurements with respect to the tissue indicative of the, at least portion of, short T2 tissue region of the tissue.

14. The method of claim 13, wherein the first TR parameter is in a range of 5 ms to 50 ms, and the second TR parameter in a range of 25 ms to 400 ms; and wherein a parameter of the first gradient crusher is in a range of 5 mT·ms/m to 500 mT·ms/m, and a parameter of the second gradient crusher is in a range of 250 mT·ms/m to 2500 mT·ms/m.

15. The method of claim 13, wherein the first TR parameter is 20 ms, and the second TR parameter is 100 ms; and wherein the first gradient crusher includes a parameter at 180 mT·ms/m and the second gradient crusher includes a parameter at 900 mT·ms/m.

16. The method of claim 13, wherein the applying the T1 mapping includes:
assigning the B1 inhomogeneity map based on a nominal flip angle, a signal ratio (r) of the first and second MR data sets, and a TR ratio (n) of the first and second TR parameters in accordance with arc cosine of ((r n−1)/(n−r)) divided by the nominal flip angle, where r is the signal ratio of the first MR data set and second MR data set (S1/S2), and n is the TR ratio of the first TR parameter and the second TR parameter (TR1/TR2); and
determining the T1 measurement by fitting the acquired MR data with variable flip angle values.

17. The method of claim 16, wherein the fitting the acquired MR data with variable TR values includes calculating T1 values using $$S_{spgr} = M_0 \sin(B_{1s}\theta) \frac{1-E_s}{1-E_s\cos(B_{1s}\theta)},$$

where $E=\exp(-TR_s/T_1)$, and where $TR_s$ is the repetition time of the UTE sequence.

18. The method of claim 13, wherein the tissue includes soft tissue in a whole joint.

19. The method of claim 18, wherein the whole joint includes a knee joint, and the soft tissue includes one or more of cartilage, meniscus, quadriceps tendon, patellar tendon, anterior cruciate ligament, posterior cruciate ligament, marrow or muscle.

* * * * *